(12) United States Patent
Kikuchi et al.

(10) Patent No.: US 8,563,214 B2
(45) Date of Patent: Oct. 22, 2013

(54) RADIATION SENSITIVE RESIN COMPOSITION AND METHOD OF FORMING AN INTERLAYER INSULATING FILM

(75) Inventors: Katsuhiro Kikuchi, Osaka (JP); Kentaro Usui, Osaka (JP); Masakazu Shibasaki, Osaka (JP); Takashi Ochi, Osaka (JP); Tatsuro Kato, Osaka (JP); Kenichi Hamada, Tokyo (JP); Masashi Arai, Tokyo (JP); Megumi Murata, Tokyo (JP); Hideaki Takase, Tokyo (JP)

(73) Assignees: Sharp Corporation, Osaka-shi (JP); JSR Corporation, Tokyo (JP)

( * ) Notice: Subject to any disclaimer, the term of this patent is extended or adjusted under 35 U.S.C. 154(b) by 0 days.

(21) Appl. No.: 13/502,211

(22) PCT Filed: Oct. 14, 2010

(86) PCT No.: PCT/JP2010/068533
§ 371 (c)(1),
(2), (4) Date: Jul. 3, 2012

(87) PCT Pub. No.: WO2011/046230
PCT Pub. Date: Apr. 21, 2011

(65) Prior Publication Data
US 2012/0270151 A1    Oct. 25, 2012

(30) Foreign Application Priority Data
Oct. 16, 2009   (JP) .................................. 2009-239423

(51) Int. Cl.
*G03F 7/023* (2006.01)
(52) U.S. Cl.
CPC .................................... *G03F 7/0233* (2013.01)
USPC ........... 430/191; 430/165; 430/192; 430/193; 430/326; 430/330
(58) Field of Classification Search
CPC .................................................... G03F 7/0233
USPC .................... 430/18, 191, 192, 193, 326, 330
See application file for complete search history.

(56) References Cited

U.S. PATENT DOCUMENTS

| | | | | |
|---|---|---|---|---|
| 7,338,737 | B2 * | 3/2008 | Lee et al. | 430/18 |
| 8,080,350 | B2 * | 12/2011 | Banba et al. | 430/14 |
| 2005/0176889 | A1 * | 8/2005 | Kodama et al. | 525/176 |
| 2009/0166818 | A1 * | 7/2009 | Banba et al. | 257/642 |
| 2009/0191386 | A1 | 7/2009 | Takahashi et al. | |

FOREIGN PATENT DOCUMENTS

| | | |
|---|---|---|
| JP | 2001 100416 | 4/2001 |
| JP | 2001-100416 A | 4/2001 |
| JP | 2001-166338 A | 6/2001 |
| JP | 3247870 B2 | 11/2001 |
| JP | 2001-343743 A | 12/2001 |
| JP | 2002 278051 | 9/2002 |
| JP | 2002-278051 A | 9/2002 |
| JP | 2005-18082 A | 1/2005 |
| JP | 2005 292278 | 10/2005 |
| JP | 2005-292278 A | 10/2005 |
| JP | 2005-338400 A | 12/2005 |
| JP | 2007 078812 | 3/2007 |
| JP | 2007-78812 A | 3/2007 |
| JP | 2009 116223 | 5/2009 |
| JP | 2009-116223 A | 5/2009 |
| JP | 2009 168992 | 7/2009 |
| JP | 2009-168992 A | 7/2009 |

OTHER PUBLICATIONS

International Preliminary Report on Patentability Issued May 15, 2012 in PCT/JP10/68533 Filed Oct. 14, 2010.
International Search Report issued on Nov. 16, 2010 in PCT/JP10/068533 filed on Oct. 14, 2010.

* cited by examiner

*Primary Examiner* — John Chu
(74) *Attorney, Agent, or Firm* — Oblon, Spivak, McClelland, Maier & Neustadt, L.L.P.

(57) ABSTRACT

The present invention relates to a radiation sensitive resin composition comprising [A] an alkali-soluble resin, [B] a 1,2-quinonediazide compound and [C] a radical trapping agent.

The radiation sensitive resin composition can provide an interlayer insulating film which satisfies general requirements for an interlayer insulating film such as high light transmittance and has excellent heat-resistant dimensional stability, heat discoloration resistance and adhesion to a substrate along with the improvement of process efficiency for improving product yield at a high resolution and has excellent storage stability.

12 Claims, 2 Drawing Sheets

RADIATION SENSITIVE RESIN COMPOSITION AND METHOD OF FORMING AN INTERLAYER INSULATING FILM

This application is a 371 of PCT/JP2010/068533 filed Oct. 14, 2010. Priority to Japanese patent application 2009-239423, filed Oct. 16, 2009, is claimed.

TECHNICAL FIELD

The present invention relates to a radiation sensitive resin composition and a method of forming an interlayer insulating film.

BACKGROUND ART

An interlayer insulating film is generally formed in electronic parts such as thin film transistor (to be referred to as "TFT" hereinafter) type liquid crystal display elements, magnetic head elements, integrated circuit elements and solid-state imaging elements to insulate wires arranged in layers from each other. The above TFT type liquid crystal display elements are manufactured through the step of forming a transparent electrode film on the above interlayer insulating film and the step of further forming a liquid crystal alignment film on the transparent electrode film. Therefore, the interlayer insulating film is exposed to a high temperature in the step of forming the transparent electrode film and further to a release liquid for a resist used to form an electrode pattern. Consequently, the interlayer insulating film must have sufficiently high resistance to these.

It is preferred that the material for forming the interlayer insulating film should have a small number of steps for obtaining a required pattern shape and sufficiently high flatness. From this point of view, a radiation sensitive resin composition is widely used as the material for forming an interlayer insulating film (refer to JP-A 2001-343743).

In the field of TFT type liquid crystal display elements, demand for a screen having large-size high brightness, high definition, high-speed response and small thickness is growing, and high performance such as high resolution and high transmittance is required for the interlayer insulating film for use in the TFT type liquid crystal display elements. Further, as process efficiency for the improvement of product yield is becoming higher, the improvement of heat-resistant dimensional stability, heat discoloration resistance and adhesion to a substrate is required for the interlayer insulating film, and further the improvement of the storage stability of a radiation sensitive resin composition is desired along with the curtailment of production cost.

A color filter is also formed by using a radiation sensitive resin composition. In the field of such color filters, various methods for producing a color filter at a low cost by improving adhesion without causing the deterioration of developability and the production of the residue and by improving product throughput and yield are now under study. For example, JP-A 2005-338400 discloses a negative type colored photosensitive resin composition which comprises a binder polymer, a photopolymerizable monomer, a colorant, a photopolymerization initiator, a hindered amine compound having two or more carboxyl groups and an organic solvent and teaches that the above object is attained by this. However, the technology disclosed by JP-A 2005-338400 is specialized in the manufacture of a color filter, and the possibility of applying this technology to an interlayer insulating film is neither disclosed nor suggested.

There is unknown a radiation sensitive resin composition capable of providing an interlayer insulating film which satisfies general requirements for an interlayer insulating film such as high light transmittance and has excellent heat-resistant dimensional stability, heat discoloration resistance and adhesion to a substrate along with the improvement of process efficiency for improving product yield at a high resolution and having excellent storage stability.

DISCLOSURE OF THE INVENTION

It is an object of the present invention which has been made in view of the above situation to provide a radiation sensitive resin composition capable of providing an interlayer insulating film which satisfies general requirements for an interlayer insulating film such as high light transmittance and has excellent heat-resistant dimensional stability, heat discoloration resistance and adhesion to a substrate along with the improvement of process efficiency for improving product yield at a high resolution and having excellent storage stability.

It is another object of the present invention to provide a method of producing an interlayer insulating film which satisfies general requirements for an interlayer insulating film such as high light transmittance and has excellent heat-resistant dimensional stability, heat discoloration resistance and adhesion to a substrate.

According to the present invention, firstly, the above objects and advantages of the present invention are attained by a radiation sensitive resin composition comprising [A] an alkali-soluble resin, [B] a 1,2-quinonediazide compound, and [C] a radical trapping agent.

Secondary, the above objects and advantages of the present invention are attained by a method of forming an interlayer insulating film, comprising the following steps in the mentioned order:
(1) a step of applying the above radiation sensitive resin composition to a substrate to form a coating film;
(2) a step of applying radiation to at least part of the coating film;
(3) a step of developing the coating film; and
(4) a step of heating the coating film.

BEST MODE FOR CARRYING OUT THE INVENTION

Figure 1:
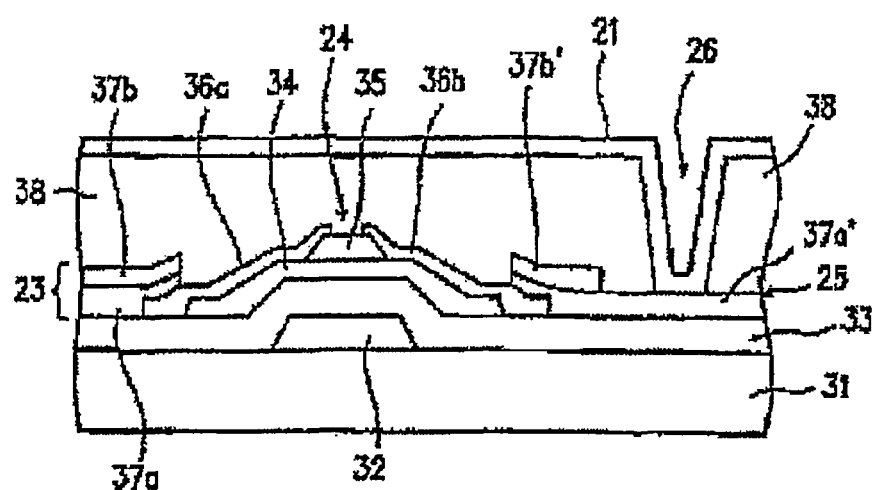
FIG. 1 is a sectional view of an example of a liquid crystal display element to which the radiation sensitive resin composition of the present invention can be applied.

The radiation sensitive resin composition of the present invention will be described in detail hereinunder.

The radiation sensitive resin composition of the present invention comprises:
[A] an alkali-soluble resin,
[B] a 1,2-quinonediazide compound, and
[C] a radical trapping agent.

[A] Alkali-Soluble Resin

The alkali-soluble resin [A] contained in the radiation sensitive resin composition of the present invention is not particularly limited if it has solubility in an alkali developer used in the developing step which will be described hereinafter. This alkali-soluble resin is preferably an alkali-soluble resin having a carboxyl group, more preferably a copolymer of (a)

at least one selected from the group consisting of unsaturated carboxylic acids and unsaturated carboxylic anhydrides (to be referred to as "compound (a1)" hereinafter) and (a2) an unsaturated compound except for (a1) (to be referred to as "compound (a2)" hereinafter).

The above compound (a1) is at least one selected from the group consisting of unsaturated carboxylic acids and unsaturated carboxylic anhydrides having radical polymerizability, such as monocarboxylic acids, dicarboxylic acids, dicarboxylic anhydrides, mono[(meth)acryloyloxyalkyl]esters of a polycarboxylic acid, mono(meth)acrylates of a polymer having a carboxyl group and a hydroxyl group at both ends, polycyclic compounds having a carboxyl group and anhydrides thereof.

Specific examples thereof include monocarboxylic acids such as acrylic acid, methacrylic acid and crotonic acid; dicarboxylic acids such as maleic acid, fumaric acid, citraconic acid, mesaconic acid and itaconic acid; dicarboxylic anhydrides such as anhydrides of compounds enumerated as the above dicarboxylic acids; mono[(meth)acryloyloxyalkyl] esters of a polycarboxylic acid such as mono[2-(meth)acryloyloxyethyl]succinate and mono[2-(meth)acryloyloxyethyl]phthalate; mono(meth)acrylates of a polymer having a carboxyl group and a hydroxyl group at both ends such as ω-carboxypolycaprolactone mono(meth)acrylate; and polycyclic compounds having a carboxyl group and anhydrides thereof such as 5-carboxybicyclo[2.2.1]hept-2-ene, 5,6-dicarboxybicyclo[2.2.1]hept-2-ene, 5-carboxy-5-methylbicyclo[2.2.1]hept-2-ene, 5-carboxy-5-ethylbicyclo[2.2.1]hept-2-ene, 5-carboxy-6-methylbicyclo[2.2.1]hept-2-ene, 5-carboxy-6-ethylbicyclo[2.2.1]hept-2-ene and 5,6-dicarboxybicyclo[2.2.1]hept-2-ene anhydride.

Out of these, monocarboxylic acids and dicarboxylic anhydrides are preferred, and acrylic acid, methacrylic acid and maleic anhydride are particularly preferred from the viewpoints of copolymerization reactivity, solubility in an alkali aqueous solution and easy acquisition. These compounds (a1) may be used alone or in combination.

The above compound (a2) is selected from (a2-1) an unsaturated compound containing an epoxy group (to be referred to as "compound (a2-1)" hereinafter) and (a2-2) another unsaturated compound (to be referred to as "compound (a2-2)" hereinafter).

The epoxy group in the compound (a2-1) is a concept including an oxiranyl group (1,2-epoxy group) and an oxetanyl group (1,3-epoxy group).

Examples of the compound (a2-1) having an oxiranyl group include glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, o-vinylbenzyl glycidyl ether, m-vinylbenzyl glycidyl ether and p-vinylbenzyl glycidyl ether. Out of these, glycidyl methacrylate, 6,7-epoxyheptyl methacrylate, o-vinylbenzyl glycidyl ether, m-vinylbenzyl glycidyl ether, p-vinylbenzyl glycidyl ether and 3,4-epoxycyclohexyl methacrylate are preferred as they have high copolymerization reactivity and improve the heat resistance and surface hardness of the formed interlayer insulating film.

Examples of the compound (a2-1) having an oxetanyl group include 3-(methacryloyloxymethyl)oxetane, 3-(methacryloyloxymethyl)-3-ethyl oxetane, 3-(methacryloyloxymethyl)-2-methyl oxetane, 3-(methacryloyloxymethyl)-2-phenyl oxetane, 3-(methacryloyloxyethyl)oxetane, 3-(methacryloyloxyethyl)-3-ethyl oxetane, 2-ethyl-3-(methacryloyloxyethyl)oxetane and 3-(methacryloyloxyethyl)-2-phenyl oxetane.

These compounds (a2-1) may be used alone or in combination.

The above compound (a2-2) is not particularly limited if it is a radically polymerizable unsaturated compound except for the above compound (a1) and the above compound (a2-1). Examples of the compound (a2-2) include methacrylic acid alkyl esters, methacrylic acid cyclic alkyl esters, acrylic acid alkyl esters, acrylic acid cyclic alkyl esters, methacrylic acid aryl esters, acrylic acid aryl esters, unsaturated dicarboxylic acid diesters, methacrylic acid esters having a hydroxyl group, bicyclo unsaturated compounds, maleimide compounds, unsaturated aromatic compounds, conjugated dienes and phenolic hydroxyl group-containing unsaturated compounds represented by the following formula (I):

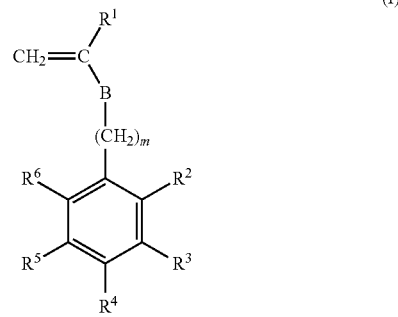

(in the formula (I), $R^1$ is a hydrogen atom or alkyl group having 1 to 4 carbon atoms, $R^2$ to $R^6$ are each independently a hydrogen atom, hydroxyl group or alkyl group having 1 to 4 carbon atoms, B is a single bond, —COO— or —CONH—, and m is an integer of 0 to 3, with the proviso that at least one of $R^2$ to $R^6$ is a hydroxyl group and any bonding directions of —COO— and —CONH— are acceptable);

unsaturated compounds having a tetrahydrofuran skeleton, furan skeleton, tetrahydropyran skeleton, pyran skeleton or skeleton represented by the following formula (II):

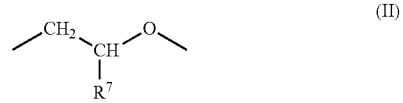

($R^7$ is a hydrogen atom or methyl group);
and other unsaturated compounds.

$R^1$ in the above formula (I) is preferably a hydrogen atom or methyl group.

Specific examples thereof include methacrylic acid alkyl esters such as methyl methacrylate, ethyl methacrylate, n-butyl methacrylate, sec-butyl methacrylate, t-butyl methacrylate, 2-ethylhexyl methacrylate, isodecyl methacrylate, n-lauryl methacrylate, tridecyl methacrylate and n-stearyl methacrylate; acrylic acid alkyl esters such as methyl acrylate and isopropyl acrylate; methacrylic acid cyclic alkyl esters such as cyclohexyl methacrylate, 2-methylcyclohexyl methacrylate, tricyclo[5.2.1.0$^{2,6}$]decan-8-yl methacrylate, tricyclo[5.2.1.0$^{2,6}$]decan-8-yloxyethyl methacrylate and isobornyl methacrylate; methacrylic acid esters having a hydroxyl group such as hydroxymethyl methacrylate, 2-hydroxyethyl methacrylate, 3-hydroxypropyl methacrylate, 4-hydroxybutyl methacrylate, diethylene glycol monomethacrylate, 2,3-dihydroxypropyl methacrylate, 2-methacryloxyethyl glycoside and 4-hydroxyphenyl methacrylate; acrylic acid cyclic alkyl esters such as cyclohexyl acrylate, 2-methylcyclohexyl acrylate, tricyclo[5.2.1.0$^{2,6}$]decan-8-yl acrylate, tricyclo[5.2.1.0$^{2,6}$]decan-8-yloxyethyl acrylate and isobornyl acrylate; methacrylic acid aryl esters such as phenyl methacrylate and benzyl methacrylate; acrylic acid aryl esters such as phenyl acrylate and benzyl acrylate: unsaturated dicarboxylic acid diesters such as diethyl maleate, diethyl fumarate and diethyl itaconate; bicyclo unsaturated compounds such as bicyclo[2.2.1]hept-2-ene, 5-methylbicyclo[2.2.1]hept-2-ene, 5-ethylbicyclo[2.2.1]hept-2-ene, 5-methoxybicyclo[2.2.1]hept-2-ene, 5-ethoxybicyclo[2.2.1]hept-2-ene, 5,6-dimethoxybicyclo[2.2.1]hept-2-ene, 5,6-diethoxybicyclo[2.2.1]hept-2-ene, 5-t-butoxycarbonylbicyclo[2.2.1]hept-2-ene, 5-cyclohexyloxycarbonylbicyclo[2.2.1]hept-2-ene, 5-phenoxycarbonylbicyclo[2.2.1]hept-2-ene, 5,6-di(t-butoxycarbonyl)bicyclo[2.2.1]hept-2-ene, 5,6-di(cyclohexyloxycarbonyl)bicyclo[2.2.1]hept-2-ene, 5-(2'-hydroxyethyl)bicyclo[2.2.1]hept-2-ene, 5,6-dihydroxybicyclo[2.2.1]hept-2-ene, 5,6-di(hydroxymethyl)bicyclo[2.2.1]hept-2-ene, 5,6-di(2'-hydroxyethyl)bicyclo[2.2.1]hept-2-ene, 5-hydroxy-5-methylbicyclo[2.2.1]hept-2-ene, 5-hydroxy-5-ethylbicyclo[2.2.1]hept-2-ene and 5-hydroxymethyl-5-methylbicyclo[2.2.1]hept-2-ene; maleimide compounds such as N-phenylmaleimide, N-cyclohexylmaleimide, N-benzylmaleimide, N-(4-hydroxyphenyl)maleimide, N-(4-hydroxybenzyl)maleimide, N-succinimidyl-3-maleimide benzoate, N-succinimidyl-4-maleimide butyrate, N-succinimidyl-6-maleimide caproate, N-succinimidyl-3-maleimide propionate and N-(9-acridinyl)maleimide; unsaturated aromatic compounds such as styrene, α-methylstyrene, m-methylstyrene, p-methylstyrene, vinyl toluene and p-methoxystyrene; conjugated dienes such as 1,3-butadiene, isoprene and 2,3-dimethyl-1,3-butadiene; unsaturated compounds having a phenolic hydroxyl group represented by the above formula (I) such as compounds represented by each of the following formulas (I-1) to (I-5):

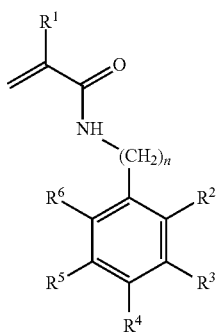

(I-1)

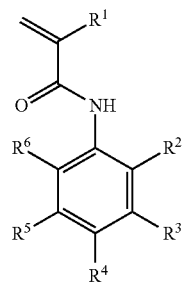

(I-2)

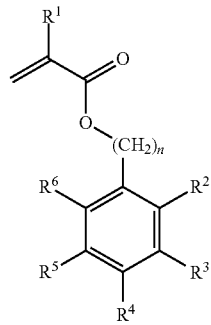

(I-3)

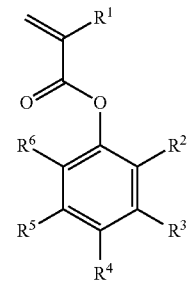

(I-4)

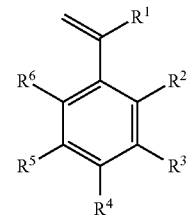

(I-5)

(in the formulas (I-1) to (I-5), n is an integer of 1 to 3, and $R^1$ to $R^6$ are each as defined in the above formula (I)); unsaturated compounds having a tetrahydrofuran skeleton such as tetrahydrofurfuryl(meth)acrylate, tetrahydrofurfuryl 2-methacryloyloxy-propionate and 3-(meth)acryloyloxy tetrahydrofuran-2-one; unsaturated compounds having a furan skeleton such as 2-methyl-5-(3-furyl)-1-penten-3-one, furfuryl(meth)acrylate, 1-furan-2-butyl-3-en-2-one, 1-furan-2-butyl-3-methoxy-3-en-2-one, 6-(2-furyl)-2-methyl-1-hexen-3-one, 6-(2-furyl)-hexy-1-en-3-one, 2-(2-furyl)-1-methyl-ethyl ester acrylate and 6-(2-furyl)-6-methyl-1-hepten-3-one; unsaturated compounds having a tetrahydropyran skeleton such as (tetrahydropyran-2-yl)methyl methacrylate, 2,6-dimethyl-8-(tetrahydropyran-2-yloxy)-oct-1-en-3-one, tetrahydropyran-2-yl ester 2-methacrylate and 1-(tetrahydropyran-2-oxy)-butyl-3-en-2-one; unsaturated compounds having a pyran skeleton such as 4-(1,4-dioxa-5-oxo-6-heptenyl)-6-methyl-2-pyrone and 4-(1,5-dioxa-6-oxo-7-octenyl)-6-methyl-2-pyrone; unsaturated compounds having a skeleton represented by the above formula (II) such as polyethylene glycol mono(meth)acrylate having 2 to 10 ethylene glycol recurring units and polypropylene glycol mono(meth)acrylate having 2 to 10 propylene glycol recurring units; and other unsaturated compounds such as acrylonitrile, methacrylonitrile, vinyl chloride, vinylidene chloride, acrylamide, methacrylamide and vinyl acetate.

Out of these, methacrylic acid alkyl esters, methacrylic acid cyclic alkyl esters, maleimide compounds, unsaturated compounds having a phenolic hydroxyl group represented by the above formula (I), and unsaturated compounds having a tetrahydrofuran skeleton, furan skeleton, tetrahydro pyran skeleton, pyran skeleton or skeleton represented by the above formula (II) are preferred, and styrene, t-butyl methacrylate, tricyclo[$5.2.1.0^{2,6}$]decan-8-yl methacrylate, p-methoxystyrene, 2-methylcyclohexyl acrylate, N-phenylmaleimide, N-cyclohexylmaleimide, tetrahydrofurfuryl(meth)acrylate, polyethylene glycol mono(meth)acrylate having 2 to 10 ethylene glycol recurring units, 3-(meth)acryloyloxy tetrahydrofuran-2-one, 4-hydroxybenzyl(meth)acrylate, 4-hydroxyphenyl(meth)acrylate, o-hydroxystyrene, p-hydroxystyrene and α-methyl-p-hydroxystyrene are particularly preferred from the viewpoint of copolymerization reactivity and solubility in an alkali developer.

These compounds (a2-2) may be used alone or in combination.

The alkali-soluble resin [A] used in the present invention contains a constituent unit derived from the compound (a1) in an amount of preferably 5 to 40 mass %, particularly preferably 5 to 25 mass % based on the total of all the recurring units derived from the compound (a1) and the compound (a2). When the content of this constituent unit is lower than 5 mass %, the alkali-soluble resin hardly dissolves in an alkali aqueous solution in the development step and when this value is larger than 40 mass %, the solubility in an alkali aqueous solution of the alkali-soluble resin may become too high.

The alkali-soluble resin [A] used in the present invention is preferably a copolymer of the compound (a1), the compound (a2-1) and the compound (a2-2). In this case, the alkali-soluble resin [A] contains a constituent unit derived from the compound (a2-1) in an amount of preferably 10 to 80 mass %, particularly preferably 30 to 80 mass % based on the total of all the recurring units derived from the compound (a1), the compound (a2-1) and the compound (a2-2). When the content of this constituent unit is lower than 10 mass %, the heat resistance, surface hardness and release liquid resistance of the formed interlayer insulating film may become unsatisfactory and when the content of the constituent unit is higher than 80 mass %, the storage stability of the obtained radiation sensitive resin composition may become unsatisfactory. The content of a constituent unit derived from the compound (a2-2) in the alkali-soluble resin [A] is preferably 10 to 80 mass %, particularly preferably 30 to 65 mass % based on the total of all the recurring units derived from the compound (a1), the compound (a2-1) and the compound (a2-2).

The mass average molecular weight in terms of polystyrene measured by gel permeation chromatography (to be referred to as "Mw" hereinafter) of the alkali-soluble resin [A] used in the present invention is preferably $2 \times 10^3$ to $1 \times 10^5$, more preferably $5 \times 10^3$ to $5 \times 10^4$. When Mw is lower than $2 \times 10^3$, the development margin (the degree of a deviation from the appropriate development time allowable in the development step) may become insufficient, whereby the film residual rate of the obtained film may lower and the pattern shape and heat resistance of the obtained interlayer insulating film may be impaired. When this value is larger than $1 \times 10^5$, sensitivity may lower or the pattern shape may be marred. The molecular weight distribution (to be referred to as "Mw/Mn" hereinafter) of the alkali-soluble resin [A] is preferably not more than 5.0, more preferably not more than 3.0. When Mw/Mn is higher than 5.0, the pattern shape of the obtained interlayer insulating film may be marred. The radiation sensitive resin composition comprising the above alkali-soluble resin [A] makes it possible to easily form a desired pattern without producing a development residue after development.

Preferred examples of the alkali-soluble resin [A] used in the present invention include a copolymer of methacrylic acid, tricyclo [$5.2.1.0^{2,6}$]decan-8-yl methacrylate, glycidyl methacrylate, 2-methylcyclohexyl acrylate and N-(3,5-dimethyl-4-hydroxybenzyl)methacrylamide, copolymer of methacrylic acid, glycidyl methacrylate, 1-(tetrahydropyran-2-oxy)-butyl-3-en-2-one, N-cyclohexylmaleimide, p-methoxystyrene, 3-ethyl-3-methacryloyloxymethyl oxetane and N-(3,5-dimethyl-4-hydroxybenzyl)methacrylamide, copolymer of methacrylic acid, tricyclo[$5.2.1.0^{2,6}$]decan-8-yl methacrylate, styrene, N-phenylmaleimide and N-(4-hydroxyphenyl)methacrylamide, copolymer of methacrylic acid, glycidyl methacrylate, tricyclo[$5.2.1.0^{2,6}$]decan-8-yl methacrylate, n-lauryl methacrylate, 3-methacryloyloxytetrahydrofuran-2-one and N-(4-hydroxyphenyl)methacrylamide, copolymer of methacrylic acid, glycidyl methacrylate, styrene, 2-methylcyclohexyl acrylate, 1-(tetrahydropyran-2-oxy)-butyl-3-en-2-one and 4-hydroxybenzyl methacrylate, copolymer of methacrylic acid, glycidyl methacrylate, tricyclo[$5.2.1.0^{2,6}$]decan-8-yl methacrylate, p-methoxystyrene and 4-hydroxybenzyl methacrylate, copolymer of methacrylic acid, tricyclo[$5.2.1.0^{2,6}$]decan-8-yl methacrylate, glycidyl methacrylate, styrene, p-vinylbenzyl glycidyl ether, tetrahydrofurfuryl methacrylate and 4-hydroxyphenyl methacrylate, copolymer of methacrylic acid, glycidyl methacrylate, N-cyclohexylmaleimide, α-methyl-p-hydroxystyrene and tetrahydrofurfuryl methacrylate, copolymer of methacrylic acid, glycidyl methacrylate, N-cyclohexylmaleimide, 3-ethyl-3-methacryloyloxymethyl oxetane, 3-methacryloyloxy tetrahydrofuran-2-one, tetrahydrofurfuryl methacrylate and 4-hydroxyphenyl methacrylate, copolymer of methacrylic acid, glycidyl methacrylate, 3-ethyl-3-methacryloyloxymethyl oxetane, tetrahydrofurfuryl methacrylate, N-phenylmaleimide and α-methyl-p-hydroxystyrene, and copolymer of methacrylic acid, glycidyl methacrylate, 3-ethyl-3-methacryloyloxymethyl oxetane, tricyclo[$5.2.1.0^{2,6}$]decan-8-yl methacrylate, N-cyclohexylmaleimide, n-lauryl methacrylate and α-methyl-p-hydroxystyrene.

The above alkali-soluble resin [A] can be synthesized by polymerizing a mixture of the compound (a1) and the compound (a2), preferably a mixture of the compound (a1), the compound (a2-1) and the compound (a2-2) preferably in a suitable solvent and preferably in the presence of a radical polymerization initiator.

The solvent used for the above polymerization is selected from alcohols, ethers, glycol ethers, ethylene glycol alkyl ether acetates, diethylene glycol alkyl ethers, propylene glycol monoalkyl ethers, propylene glycol alkyl ether acetates, propylene glycol alkyl ether propionates, aromatic hydrocarbons, ketones and esters.

Specific examples of these solvents include alcohols such as methanol, ethanol, benzyl alcohol, 2-phenyl ethanol and 3-phenyl-1-propanol; ethers such as tetrahydrofuran; ethylene glycol ethers such as ethylene glycol monomethyl ether and ethylene glycol monoethyl ether; ethylene glycol alkyl ether acetates such as ethylene glycol methyl ether acetate, ethylene glycol ethyl ether acetate, ethylene glycol n-propyl ether acetate and ethylene glycol n-butyl ether acetate; diethylene glycol alkyl ethers such as diethylene glycol monomethyl ether, diethylene glycol monoethyl ether, diethylene glycol dimethyl ether, diethylene glycol diethyl ether and diethylene glycol ethyl methyl ether; propylene glycol monoalkyl ethers such as propylene glycol monomethyl ether, propylene glycol monoethyl ether, propylene glycol mono-n-propyl ether and propylene glycol mono-n-butyl ether; propylene glycol alkyl ether acetates such as propylene glycol methyl ether acetate, propylene glycol ethyl ether acetate, propylene glycol n-propyl ether acetate and propylene glycol n-butyl ether acetate; propylene glycol alkyl ether propionates such as propylene glycol methyl ether propionate, propylene glycol ethyl ether propionate, propylene glycol n-propyl ether propionate and propylene glycol n-butyl ether propionate; aromatic hydrocarbons such as toluene and xylene; ketones such as methyl ethyl ketone, cyclohexanone and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate and butyl 3-butoxypropionate.

Out of these, ethylene glycol alkyl ether acetates, diethylene glycols, propylene glycol monoalkyl ethers and propylene glycol alkyl ether acetates are preferred, and diethylene glycol dimethyl ether, diethylene glycol ethyl methyl ether, propylene glycol methyl ether and propylene glycol methyl ether acetate are particularly preferred.

As the polymerization initiator used for the production of the alkali-soluble resin [A] may be used compounds which are generally known as radical polymerization initiators. Examples of the polymerization initiator include azo compounds such as 2,2'-azobisisobutyronitrile, 2,2'-azobis-(2,4-dimethylvaleronitrile) and 2,2'-azobis-(4-methoxy-2,4-dimethylvaleronitrile); organic peroxides such as benzoyl peroxide, lauroyl peroxide, t-butylperoxy pivalate and 1,1'-bis-(t-butylperoxy)cyclohexane; and hydrogen peroxide. When a peroxide is used as the radical polymerization initiator, a reducing agent may be used in combination with the peroxide to prepare a redox type initiator.

In the production of the alkali-soluble resin [A], a molecular weight control agent may be used to control the molecular weight. Examples of the molecular weight control agent include halogenated hydrocarbons such as chloroform and carbon tetrabromide; mercaptans such as n-hexyl mercaptan, n-octyl mercaptan, n-dodecyl mercaptan, tert-dodecyl mercaptan and thioglycolic acid; xanthogens such as dimethylxanthogen sulfide and diisopropylxanthogen disulfide; and terpinolene and α-methylstyrene dimer.

[B] 1,2-Quinonediazide Compound

The 1,2-quinonediazide compound [B] used in the present invention is selected from 1,2-naphthoquinonediazide sulfonates of trihydroxybenzophenone, 1,2-naphthoquinonediazide sulfonates of tetrahydroxybenzophenone, 1,2-naphthoquinonediazide sulfonates of pentahydroxybenzophenone, 1,2-naphthoquinonediazide sulfonates of hexahydroxybenzophenone, 1,2-naphthoquinonediazide sulfonates of (polyhydroxyphenyl)alkanes, 1,2-benzoquinonediazide sulfonic acid amide and 1,2-naphthoquinonediazide sulfonic acid amide.

Specific examples thereof include 1,2-naphthoquinonediazide sulfonates of trihydroxybenzophenone such as 2,3,4-trihydroxybenzophenone-1,2-naphthoquinoneazide-4-sulfonate, 2,3,4-trihydroxybenzophenone-1,2-naphthoquinonediazide-5-sulfonate, 2,3,4-trihydroxybenzophenone-1,2-naphthoquinonediazide-6-sulfonate, 2,3,4-trihydroxybenzophenone-1,2-naphthoquinonediazide-7-sulfonate, 2,3,4-trihydroxybenzophenone-1,2-naphthoquinonediazide-8-sulfonate, 2,4,6-trihydroxybenzophenone-1,2-naphthoquinonediazide-4-sulfonate, 2,4,6-trihydroxybenzophenone-1,2-naphthoquinonediazide-5-sulfonate, 2,4,6-trihydroxybenzophenone-1,2-naphthoquinonediazide-6-sulfonate, 2,4,6-trihydroxybenzophenone-1,2-naphthoquinonediazide-7-sulfonate and 2,4,6-trihydroxybenzophenone-1,2-naphthoquinonediazide-8-sulfonate; 1,2-naphthoquinonediazide sulfonates of tetrahydroxybenzophenone such as 2,2',4,4'-tetrahydroxybenzophenone-1,2-naphthoquinonediazide-4-sulfonate, 2,2',4,4'-tetrahydroxybenzophenone-1,2-naphthoquinonediazide-5-sulfonate, 2,2',4,4'-tetrahydroxybenzophenone-1,2-naphthoquinonediazide-6-sulfonate, 2,2',4,4'-tetrahydroxybenzophenone-1,2-naphthoquinonediazide-7-sulfonate, 2,2',4,4'-tetrahydroxybenzophenone-1,2-naphthoquinonediazide-8-sulfonate, 2,3,4,3'-tetrahydroxybenzophenone-1,2-naphthoquinonediazide-4-sulfonate, 2,3,4,3'-tetrahydroxybenzophenone-1,2-naphthoquinonediazide-5-sulfonate, 2,3,4,3'-tetrahydroxybenzophenone-1,2-naphthoquinonediazide-6-sulfonate, 2,3,4,3'-tetrahydroxybenzophenone-1,2-naphthoquinonediazide-7-sulfonate, 2,3,4,3'-tetrahydroxybenzophenone-1,2-naphthoquinonediazide-8-sulfonate, 2,3,4,4'-tetrahydroxybenzophenone-1,2-naphthoquinonediazide-4-sulfonate, 2,3,4,4'-tetrahydroxybenzophenone-1,2-naphthoquinonediazide-5-sulfonate, 2,3,4,4'-tetrahydroxybenzophenone-1,2-naphthoquinonediazide-6-sulfonate, 2,3,4,4'-tetrahydroxybenzophenone-1,2-naphthoquinonediazide-7-sulfonate, 2,3,4,4'-tetrahydroxybenzophenone-1,2-naphthoquinonediazide-8-sulfonate, 2,3,4,2'-tetrahydroxy-4'-methylbenzophenone-1,2-naphthoquinonediazide-4-sulfonate, 2,3,4,2'-tetrahydroxy-4'-methylbenzophenone-1,2-naphthoquinonediazide-5-sulfonate, 2,3,4,2'-tetrahydroxy-4'-methylbenzophenone-1,2-naphthoquinonediazide-6-sulfonate, 2,3,4,2'-tetrahydroxy-4'-methylbenzophenone-1,2-naphthoquinonediazide-7-sulfonate, 2,3,4,2'-tetrahydroxy-4'-methylbenzophenone-1,2-naphthoquinonediazide-8-sulfonate, 2,3,4,4'-tetrahydroxy-3'-methoxybenzophenone-1,2-naphthoquinonediazide-4-sulfonate, 2,3,4,4'-tetrahydroxy-3'-methoxybenzophenone-1,2-naphthoquinonediazide-5-sulfonate, 2,3,4,4'-tetrahydroxy-3'-methoxybenzophenone- 1,2-naphthoquinonediazide-6-sulfonate, 2,3,4,4'-tetrahydroxy-3'-methoxybenzophenone-1,2-naphthoquinonediazide-7-sulfonate and 2,3,4,4'-tetrahydroxy-3'-methoxybenzophenone-1,2-naphthoquinonediazide-8-sulfonate; 1,2-naphthoquinonediazide sulfonates of pentahydroxybenzophenone such as 2,3,4,2',6'-pentahydroxybenzophenone-1,2-naphthoquinonediazide-4-sulfonate, 2,3,4,2',6'-pentahydroxybenzophenone-1,2-naphthoquinonediazide-5-sulfonate, 2,3,4,2',6'-pentahydroxybenzophenone-1,2-naphthoquinonediazide-6-sulfonate, 2,3,4,2',6'-pentahydroxybenzophenone-1,2-naphthoquinonediazide-7-sulfonate and 2,3,4,2',6'-pentahydroxybenzophenone-1,2-naphthoquinonediazide-8-sulfonate; 1,2-naphthoquinonediazide sulfonates of hexahydroxybenzophenone such as 2,4,6,3',4',5'-hexahydroxybenzophenone-1,2-naphthoquinonediazide-4-sulfonate, 2,4,6,3',4',5'-hexahydroxybenzophenone-1,2-naphthoquinonediazide-5-sulfonate, 2,4,6,3',4',5'-hexahydroxybenzophenone-1,2-naphthoquinonediazide-6-sulfonate, 2,4,6,3',4',5'-hexahydroxybenzophenone-1,2-naphthoquinonediazide-7-sulfonate, 2,4,6,3',4',5'-hexahydroxybenzophenone-1,2-naphthoquinonediazide-8-sulfonate, 3,4,5,3',4',5'-hexahydroxybenzophenone-1,2-naphthoquinonediazide-4-sulfonate, 3,4,5,3',4',5'-hexahydroxybenzophenone-1,2-naphthoquinonediazide-5-sulfonate, 3,4,5,3',4',5'-hexahydroxybenzophenone-1,2-naphthoquinonediazide-6-sulfonate, 3,4,5,3',4',5'-hexahydroxybenzophenone-1,2-naphthoquinonediazide-7-sulfonate and 3,4,5,3',4',5'-hexahydroxybenzophenone-1,2-naphthoquinonediazide-8-sulfonate; and 1,2-naphthoquinonediazide sulfonates of (polyhydroxyphenyl) alkanes such as bis(2,4-dihydroxyphenyl)methane-1,2-naphthoquinonediazide-4-sulfonate, bis(2,4-dihydroxyphenyl)methane-1,2-naphthoquinonediazide-5-sulfonate, bis(2,4-dihydroxyphenyl)methane-1,2-naphthoquinonediazide-6-sulfonate, bis(2,4-dihydroxyphenyl)methane-1,2-naphthoquinonediazide-7-sulfonate, bis(2,4-dihydroxyphenyl)methane-1,2-naphthoquinonediazide-8-sulfonate, bis(p-hydroxyphenyl)methane-1,2-naphthoquinonediazide-4-sulfonate, bis(p-hydroxyphenyl)methane-1,2-naphthoquinonediazide-5-sulfonate, bis(p-hydroxyphenyl)methane-1,2-naphthoquinonediazide-6-sulfonate, bis(p-hydroxyphenyl)methane-1,2-naphthoquinonediazide-7-sulfonate, bis(p-hydroxyphenyl)methane-1,2-naphthoquinonediazide-8-sulfonate, tri(p-hydroxyphenyl)methane-1,2-naphthoquinonediazide-4-sulfonate, tri(p-hydroxyphenyl)methane-1,2-naphthoquinonediazide-5-sulfonate, tri(p-hydroxyphenyl)methane-1,2-naphthoquinonediazide-6-sulfonate, tri(p-hydroxyphenyl)methane-1,2-naphthoquinonediazide-7-sulfonate, tri(p-hydroxyphenyl)methane-1,2-naphthoquinonediazide-8-sulfonate, 1,1,1-tri(p-hydroxyphenyl)ethane-1,2-naphthoquinonediazide-4-sulfonate, 1,1,1-tri(p-hydroxyphenyl)ethane-1,2-naphthoquinonediazide-5-sulfonate, 1,1,1-tri(p-hydroxyphenyl)ethane-1,2-naphthoquinonediazide-6-sulfonate, 1,1,1-tri(p-hydroxyphenyl)ethane-1,2-naphthoquinonediazide-7-sulfonate, 1,1,1-tri(p-hydroxyphenyl)ethane-1,2-naphthoquinonediazide-8-sulfonate, bis(2,3,4-trihydroxyphenyl)methane-1,2-naphthoquinonediazide-4-sulfonate, bis(2,3,4-trihydroxyphenyl)methane-1,2-naphthoquinonediazide-5-sulfonate, bis(2,3,4-trihydroxyphenyl)methane-1,2-naphthoquinonediazide-6-sulfonate, bis(2,3,4-trihydroxyphenyl)methane-1,2-naphthoquinonediazide-7-sulfonate, bis(2,3,4-trihydroxyphenyl)methane-1,2-naphthoquinonediazide-8-sulfonate, 2,2-bis(2,3,4-trihydroxyphenyl)propane-1,2-naphthoquinonediazide-4-sulfonate, 2,2-bis(2,3,4-trihydroxyphenyl)propane-1,2-naphthoquinonediazide-5-sulfonate, 2,2-bis(2,3,4-trihydroxyphenyl)propane-1,2-naphthoquinonediazide-6-sulfonate, 2,2-bis(2,3,4-trihydroxyphenyl)propane-1,2-naphthoquinonediazide-7-sulfonate, 2,2-bis(2,3,4-trihydroxyphenyl)propane-1,2-naphthoquinonediazide-8-sulfonate, 1,1,3-tris(2,5-dimethyl-4-hydroxyphenyl)-3-phenylpropane-1,2-naphthoquinonediazide-4-sulfonate, 1,1,3-tris(2,5-dimethyl-4-hydroxyphenyl)-3-phenylpropane-1,2-naphthoquinonediazide-5-sulfonate, 1,1,3-tris(2,5-dimethyl-4-hydroxyphenyl)-3-phenylpropane-1,2-naphthoquinonediazide-6-sulfonate, 1,1,3-tris(2,5-dimethyl-4-hydroxyphenyl)-3-phenylpropane-1,2-naphthoquinonediazide-7-sulfonate, 1,1,3-tris(2,5-dimethyl-4-hydroxyphenyl)-3-phenylpropane-1,2-naphthoquinonediazide-8-sulfonate, 4,4'-[1-[4-[1-[4-hydroxyphenyl]-1-methylethyl]phenyl]ethylidene]bisphenol-1,2-naphthoquinonediazide-4-sulfonate, 4,4'-[1-[4-[1-[4-hydroxyphenyl]-1-methylethyl]phenyl]ethylidene]bisphenol-1,2-naphthoquinonediazide-5-sulfonate, 4,4'-[1-[4-[1-[4-hydroxyphenyl]-1-methylethyl]phenyl]ethylidene]bisphenol-1,2-naphthoquinonediazide-6-sulfonate, 4,4'-[1-[4-[1-[4-hydroxyphenyl]-1-methylethyl]phenyl]ethylidene]bisphenol-1,2-naphthoquinonediazide-7-sulfonate, 4,4'-[1-[4-[1-[4-hydroxyphenyl]-1-methylethyl]phenyl]ethylidene]bisphenol-1,2-naphthoquinonediazide-8-sulfonate, bis(2,5-dimethyl-4-hydroxyphenyl)-2-hydroxyphenylmethane-1,2-naphthoquinonediazide-4-sulfonate, bis(2,5-dimethyl-4-hydroxyphenyl)-2-hydroxyphenylmethane-1,2-naphthoquinonediazide-5-sulfonate, bis(2,5-dimethyl-4-hydroxyphenyl)-2-hydroxyphenylmethane-1,2-naphthoquinonediazide-6-sulfonate, bis(2,5-dimethyl-4-hydroxyphenyl)-2-hydroxyphenylmethane-1,2-naphthoquinonediazide-7-sulfonate, bis(2,5-dimethyl-4-hydroxyphenyl)-2-hydroxyphenylmethane-1,2-naphthoquinonediazide-8-sulfonate, 3,3,3',3'-tetramethyl-1,1'-spirobiindene-5,6,7,5',6',7'-hexanol-1,2-naphthoquinonediazide-4-sulfonate, 3,3,3',3'-tetramethyl-1,1'-spirobiindene-5,6,7,5',6',7'-hexanol-1,2-naphthoquinonediazide-5-sulfonate, 3,3,3',3'-tetramethyl-1,1'-spirobiindene-5,6,7,5',6',7'-hexanol-1,2-naphthoquinonediazide-6-sulfonate, 3,3,3',3'-tetramethyl-1,1'-spirobiindene-5,6,7,5',6',7'-hexanol-1,2-naphthoquinonediazide-7-sulfonate, 3,3,3',3'-tetramethyl-1,1'-spirobiindene-5,6,7,5',6',7'-hexanol-1,2-naphthoquinonediazide-8-sulfonate, 2,2,4-trimethyl-7,2',4'-trihydroxyflavan-1,2-naphthoquinonediazide-4-sulfonate, 2,2,4-trimethyl-7,2',4'-trihydroxyflavan-1,2-naphthoquinonediazide-5-sulfonate, 2,2,4-trimethyl-7,2',4'-trihydroxyflavan-1,2-naphthoquinonediazide-6-sulfonate, 2,2,4-trimethyl-7,2',4'-trihydroxyflavan-1,2-naphthoquinonediazide-7-sulfonate and 2,2,4-trimethyl-7,2',4'-trihydroxyflavan-1,2-naphthoquinonediazide-8-sulfonate.

These 1,2-quinonediazide compounds may be used alone or in combination of two or more.

The amount of the 1,2-quinonediazide compound [B] is preferably 5 to 100 parts by mass, more preferably 10 to 50 parts by mass based on 100 parts by mass of the alkali-soluble resin [A]. When this amount is smaller than 5 parts by mass, the difference in solubility in an alkali aqueous solution as a developer between an exposed portion and an unexposed portion becomes small due to a small amount of an acid produced by the application of radiation, thereby making patterning difficult. In addition, satisfactory heat resistance and solvent resistance may not be obtained as the amount of the acid used in the reaction with the alkali-soluble resin [A] is small. When the amount is larger than 100 parts by mass, a large amount of the unreacted 1,2-quinonediazide compound [B] remains, whereby its insolubilization effect in the above alkali aqueous solution becomes too large, thereby making development difficult.

[C] Radical Trapping Agent

In the step of forming an interlayer insulating film or the subsequent step of manufacturing an electronic device, when excessive heat or light is applied, a radical may be produced in the polymer film. When the radical is produced in the polymer film, it may trigger the formation of an unpreferred radical or peroxide. Since the radical or the peroxide is chemically unstable, it readily reacts with another compound to produce a new radical, thereby causing chain oxidation degradation and inducing the functional deterioration of the interlayer insulating film. The above functional deterioration of the interlayer insulating film means the reduction of resolution, the destabilization of a pattern size, the reduction of transparency and the deterioration of the storage stability of the composition.

To prevent these phenomena, the radiation sensitive resin composition of the present invention comprises [C] a radical trapping agent so as to suppress the rapid production of a radical.

The radical trapping agent [C] used in the present invention is at least one selected from the group consisting of hindered phenol compounds, hindered amine compounds, alkyl phosphate compounds and sulfur atom-containing compounds.

The above hindered phenol compounds include pentaerythritol tetrakis[3-(3,5-di-tert-butyl-4-hydroxyphenyl) propionate], thiodiethylenebis[3-(3,5-di-tert-butyl-4-hydroxyphenyl)propionate], octadecyl-3-(3,5-di-tert-butyl-4-hydroxyphenyl)propionate, 1,3,5-trimethyl-2,4,6-tris(3,5-di-tert-butyl-4-hydroxybenzyl)benzene, N,N'-hexane-1,6-diylbis[3-(3,5-di-tert-butyl-4-hydroxyphenylpropionamide), 3,3',3'',5',5''-hexa-tert-butyl-α,α',α''-(mesitylene-2,4,6-tolyl)tri-p-cresol, 4,6-bis(octylthiomethyl)-o-cresol, 4,6-bis (dodecylthiomethyl)-o-cresol, ethylenebis(oxyethylene)bis [3-(5-tert-butyl-4-hydroxy-m-tolyl)propionate, hexamethylenebis[3-(3,5-di-tert-butyl-4-hydroxyphenyl) propionate], 1,3,5-tris(3,5-di-tert-butyl-4-hydroxybenzyl)-1, 3,5-triazine-2,4,6(1H,3H,5H)-trione, 1,3,5-tris[(4-tert-butyl-3-hydroxy-2,6-xylylene)methyl]-1,3,5-triazine-2,4,6(1H, 3H,5H)trione, 2,6-di-tert-butyl-4-(4,6-bis(octylthio)-1,3,5-triazin-2-ylamine)phenol and 3,9-bis[1,1-dimethyl-2-[β-(3-t-butyl-4-hydroxy-5-methylphenyl)propionyloxy]ethyl]2,4, 8,10-tetraoxaspiro[5.5]-undecane.

Commercially available products thereof include ADECASTAB AO-20, ADECASTAB AO-30, ADECASTAB AO-40, ADECASTAB AO-50, ADECASTAB AO-60, ADECASTAB AO-70, ADECASTAB AO-80 and ADECASTAB AO-330 (of ADEKA Corporation); sumilizer GM, sumilizer GS, sumilizer MDP-S, sumilizer BBM-S, sumilizer WX-R and sumilizer GA-80 (of Sumitomo Chemical Co., Ltd.); IRGANOX 1010, IRGANOX 1035, IRGANOX 1076, IRGANOX 1098, IRGANOX 1135, IRGANOX 1330, IRGANOX 1726, IRGANOX 1425WL, IRGANOX 1520L, IRGANOX 245, IRGANOX 259, IRGANOX 3114, IRGANOX 565 and IRGAMOD 295 (of Ciba Specialty Chemicals); and YOSHINOX BHT, YOSHINOX BB, YOSHINOX 2246G, YOSHINOX 425, YOSHINOX 250, YOSHINOX 930, YOSHINOX SS, YOSHINOX TT, YOSHINOX 917 and YOSHINOX 314 (of API Corporation).

The above hindered amine compounds include tetrakis(2, 2,6,6-pentamethyl-4-piperidyl)1,2,3,4-butane tetracarboxylate, bis(1-octyloxy-2,2,6,6-tetramethyl-4-piperidyl)sebacate and bis(1,2,2,6,6-pentamethyl-4-piperidyl)[[3,5-bis(1, 1-dimethylethyl)-4-hydroxyphenyl]methyl]butyl malonate. Commercially available products thereof include ADECASTAB LA-52, ADECASTAB LA-57, ADECASTAB LA-62, ADECASTAB LA-67, ADECASTAB LA-63P, ADECASTAB LA-68LD, ADECASTAB LA-77, ADECASTAB LA-82 and ADECASTAB LA-87 (of ADEKA Corporation); sumilizer 9A (of Sumitomo Chemical Co., Ltd.); and CHIMASSORB 119FL, CHIMASSORB2020FDL, CHIMASSORB 944FDL, TINUVIN 622LD, TINUVIN 123, TINUVIN 144, TINUVIN 765 and TINUVIN 770DF (of Ciba Specialty Chemicals).

The above alkyl phosphate compounds include butylidenebis{2-tert-butyl-5-methyl-p-phenylene}-P,P,P,P-tetratridecylbis(phosphine), distearyl pentaerythritol diphosphite, 2,2'-methylenebis(4,6-di-tert-butyl-1-phenyloxy)(2-ethylhexyloxy)phosphorus, tris(2,4-di-tert-butylphenyl) phosphite and 3,9-bis(2,6-di-tert-butyl-4-methylphenoxy)-2, 4,8,10-tetraoxa-3,9-diphosphaspiro[5.5]undecane.

Commercially available products thereof include ADECASTAB PEP-4C, ADECASTAB PEP-8, ADECASTAB PEP-8W, ADECASTAB PEP-24G, ADECASTAB PEP-36, ADECASTAB HP-10, ADECASTAB 2112, ADECASTAB 260, ADECASTAB 522A, ADECASTAB 1178, ADECASTAB 1500, ADECASTAB C, ADECASTAB 135A, ADECASTAB 3010 and ADECASTAB TPP (of ADEKA Corporation); and IRGAFOS 168 (of Ciba Specialty Chemicals).

The above sulfur atom-containing compounds include pentaerythritol tetrakis(3-laurylthiopropionate), di(propionate-n-tridecanyl)sulfide, thiodiethylene and bis[3-(3,5-di-tert-butyl-4-hydroxyphenyl)propionate, and commercially available products of the thioether include ADECASTAB AO-412S and ADECASTAB AO-503 (of ADEKA Corporation); sumilizer TPL-R, sumilizer TPM, sumilizer TPS, sumilizer TP-D and sumilizer MB (of Sumitomo Chemical Co., Ltd.); IRGANOX PS800FD, IRGANOX PS802FD and IRGANOX 1035 (of Ciba Specialty Chemicals); and DLTP, DSTP, DMTP and DTTP (of API Corporation).

The amount of the radical trapping agent [C] in the radiation sensitive resin composition of the present invention is preferably 0.1 to 30 parts by mass, more preferably 1 to 30 parts by mass based on 100 parts by mass of the alkali-soluble resin [A]. When this amount is 0.1 to 30 parts by mass, the deterioration of the storage stability of the radiation sensitive resin composition can be prevented without the destabilization of the pattern size of the formed interlayer insulating film, the reduction of transparency and the reduction of resolution at the time of forming the interlayer insulating film.

Other Components

The radiation sensitive resin composition of the present invention comprises the above alkali-soluble resin [A], the 1,2-quinonediazide compound [B] and the radical trapping agent [C] as essential components and can further comprise other components as required. The other components include [D] a heat-sensitive acid producing compound, [E] a polymerizable compound having at least one ethylenically unsaturated double bond, [F] an epoxy resin (excluding the alkali-soluble resin [A]), [G] a surfactant and [H] an adhesive aid.

The above heat-sensitive acid producing compound [D] may be used to further improve the heat resistance and hardness of the formed interlayer insulating film. Examples of the compound include onium salts such as sulfonium salts, benzothiazonium salts, ammonium salts and phosphonium salts.

The above sulfonium salts include alkyl sulfonium salts, benzyl sulfonium salts, dibenzyl sulfonium salts and substituted benzyl sulfonium salts.

The above sulfonium salts include alkyl sulfonium salts, benzyl sulfonium salts, dibenzyl sulfonium salts and substituted benzyl sulfonium salts.

Specific examples thereof include alkyl sulfonium salts such as 4-acetophenyldimethylsulfonium hexafluoroantimonate, 4-acetoxyphenyldimethylsulfonium hexafluoroarsenate, dimethyl-4-(benzyloxycarbonyloxy)phenylsulfonium hexafluoroantimonate, dimethyl-4-(benzoyloxy)phenylsulfonium hexafluoroantimonate, dimethyl-4-(benzoyloxy)phenylsulfonium hexafluoroarsenate and dimethyl-3-chloro-4-acetoxyphenylsulfonium hexafluoroantimonate; benzyl sulfonium salts such as benzyl-4-hydroxyphenylmethylsulfonium hexafluoroantimonate, benzyl-4-hydroxyphenylmethylsulfonium hexafluorophosphate, 4-acetoxyphenylbenzylmethylsulfonium hexafluoroantimonate, benzyl-4-methoxyphenylmethylsulfonium hexafluoroantimonate, benzyl-2-methyl-4-hydroxyphenylmethylsulfonium hexafluoroantimonate, benzyl-3-chloro-4-hydroxyphenylmethylsulfonium hexafluroarsenate and 4-methoxybenzyl-4-hydroxyphenylmethylsulfonium hexafluorophosphate; dibenzyl sulfonium salts such as dibenzyl-4-hydroxyphenylsulfonium hexafluoroantimonate, dibenzyl-4-hydroxyphenylsulfonium hexafluorophosphate, 4-acetoxyphenyldibenzylsulfonium hexafluoroantimonate, dibenzyl-4-methoxyphenylsulfonium hexafluoroantimonate, dibenzyl-3-chloro-4-hydroxyphenylsulfonium hexafluoroarsenate, dibenzyl-3-methyl-4-hydroxy-5-tert-butylphenylsulfonium hexafluoroantimonate and benzyl-4-methoxybenzyl-4-hydroxyphenylsulfonium hexafluorophosphate; and substituted benzyl sulfonium salts such as p-chlorobenzyl-4-hydroxyphenylmethylsulfonium hexafluoroantimonate, p-nitrobenzyl-4-hydroxyphenylmethylsulfonium hexafluoroantimonate, p-chlorobenzyl-4-hydroxyphenylmethylsulfonium hexafluorophosphate, p-nitrobenzyl-3-methyl-4-hydroxyphenylmethylsulfonium hexafluoroantimonate, 3,5-dichlorobenzyl-4-hydroxyphenylmethylsulfonium hexafluoroantimonate and o-chlorobenzyl-3-chloro-4-hydroxyphenylmethylsulfonium hexafluoroantimonate.

The above benzothiazonium salts include benzyl benzothiazonium salts such as 3-benzylbenzothiazonium hexafluoroantimonate, 3-benzylbenzothiazonium hexafluorophosphate, 3-benzylbenzothiazonium tetrafluoroborate, 3-(p-methoxybenzyl)benzothiazonium hexafluoroantimonate, 3-benzyl-2-methylthiobenzothiazonium hexafluoroantimonate and 3-benzyl-5-chlorobenzothiazonium hexafluoroantimonate.

Out of these, sulfonium salts and benzothiazonium salts are preferably used, and 4-acetoxyphenyldimethylsulfonium hexafluoroarsenate, benzyl-4-hydroxyphenylmethylsulfonium hexafluoroantimonate, 4-acetoxyphenylbenzylmethylsulfonium hexafluoroantimonate, dibenzyl-4-hydroxyphenylsulfonium hexafluoroantimonate, 4-acetoxyphenylbenzylsulfonium hexafluoroantimonate and 3-benzylbenzothiazolium hexafluoroantimonate are particularly preferably used.

Examples of the heat-sensitive acid producing compound [D] include SAN-AID SI-L85, SI-L110, SI-L145, SI-L150 and SI-L160 (of Sanshin Chemical Industry Co., Ltd.).

The amount of the heat-sensitive acid producing compound [D] is preferably not more than 20 parts by mass, more preferably 0.1 to 20 parts by mass, much more preferably 1 to 5 parts by mass based on 100 parts by mass of the alkali-soluble resin [A]. When this amount is 0.1 to 20 parts by mass, the formed interlayer insulating film has satisfactory hardness.

The above polymerizable compound having at least one ethylenically unsaturated double bond [E] (may be referred to as "polymerizable compound [E]" hereinafter) is preferably selected from monofunctional (meth)acrylates, bifunctional (meth)acrylates and trifunctional or higher functional (meth)acrylates.

The above monofunctional (meth)acrylates include 2-hydroxyethyl(meth)acrylate, carbitol(meth)acrylate, isobornyl (meth)acrylate, 3-methoxybutyl(meth)acrylate and 2-(meth) acryloyloxyethyl-2-hydroxypropyl phthalate, and commercially available products thereof include Aronix M-101, M-111 and M-114 (of Toagosei Co., Ltd.), KAYARAD TC-110S and TC-120S (of Nippon Kayaku Co., Ltd.) and Viscoat 158 and 2311 (of Osaka Organic Chemical Industry Ltd.).

The above bifunctional (meth)acrylates include ethylene glycol(meth)acrylate, 1,6-hexanediol di(meth)acrylate, 1,9-nonanediol di(meth)acrylate, polypropylene glycol di(meth)acrylate, tetraethylene glycol di(meth)acrylate, bisphenoxyethanol fluorene diacrylate and bisphenoxyethanol fluorene diacrylate. Commercially available products thereof include Aronix M-210, M-240 and M-6200 (of Toagosei Co., Ltd.), KAYARAD HDDA, HX-220 and R-604 (of Nippon Kayaku Co., Ltd.) and Viscoat 260, 312 and 335HP (of Osaka Organic Chemical Industry Ltd.).

The above trifunctional or higher functional (meth)acrylates include trimethylolpropane tri(meth)acrylate, pentaerythritol tri(meth)acrylate, tri((meth)acryloyloxyethyl) phosphate, pentaerythritol tetra(meth)acrylate, dipentaerythritol penta(meth)acrylate and dipentaerythritol hexa(meth)acrylate, and commercially available products thereof include Aronix M-309, M-400, M-405, M-450, M-7100, M-8030 and M-8060 (of Toagosei Co., Ltd.), KAYARAD TMPTA, DPHA, DPCA-20, DPCA-30, DPCA-60 and DPCA-120 (of Nippon Kayaku Co., Ltd.) and Viscoat 295, 300, 360, GPT, 3PA and 400 (of Osaka Organic Chemical Industry Ltd.).

These polymerizable compounds [E] may be used alone or in combination.

Out of these, trifunctional or higher functional (meth)acrylates are preferably used, and trimethylolpropane tri(meth) acrylate, pentaerythritol tetra(meth)acrylate and dipentaerythritol hexa(meth)acrylate are particularly preferred.

The amount of the polymerizable compound [E] is preferably not more than 50 parts by mass, more preferably 1 to 50 parts by mass, much more preferably 3 to 30 parts by mass based on 100 parts by mass of the alkali-soluble resin [A]. When the above polymerizable compound [E] is contained within the above range, the heat resistance and surface hardness of the interlayer insulating film obtained from the radiation sensitive resin composition of the present invention can be further improved.

The above epoxy resin [F] (excluding the alkali-soluble resin [A]) is not particularly limited if its compatibility with the alkali-soluble resin [A] is not affected. Preferred examples of the epoxy resin [F] include bisphenol A type epoxy resin, phenol novolak type epoxy resin, cresol novolak type epoxy resin, cyclic aliphatic epoxy resin, glycidyl ester type epoxy resin, glycidyl amine type epoxy resin, heterocyclic epoxy resin and resin obtained by (co)polymerizing glycidyl methacrylate. Out of these, bisphenol A type epoxy resin, cresol novolak type epoxy resin and glycidyl ester type epoxy resin are particularly preferred.

The amount of the epoxy resin [F] is preferably not more than 50 parts by mass, more preferably 1 to 50 parts by mass, much more preferably 3 to 30 parts by mass based on 100 parts by mass of the alkali-soluble resin [A].

When the epoxy resin [F] is contained within the above range, the heat resistance and surface hardness of the interlayer insulating film obtained from the radiation sensitive resin composition of the present invention can be further improved.

When the alkali-soluble resin [A] is a copolymer of a mixture of unsaturated compounds including the compound (a2-1), it can be said that the alkali-soluble resin [A] is an "epoxy resin". However, it differs from the epoxy resin [F] as it has alkali solubility. The epoxy resin [F] is alkali-insoluble.

To further improve coatability, the radiation sensitive resin composition of the present invention may contain the above surfactant [G]. The surfactant [G] which can be used herein is preferably selected from fluorine-based surfactants, silicone-based surfactants and nonionic surfactants.

The above fluorine-based surfactants include 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol(1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane and sodium fluoroalkylbenzene sulfonates; fluoroalkyloxyethylene ethers; fluoroalkylammonium iodides, fluoroalkylpolyoxyethylene ethers and perfluoroalkylpolyoxy ethanols; perfluoroalkyl alkoxylates; and fluorine-based alkyl esters. Commercially available products thereof include BM-1000 and BM-1100 (of BM Chemie GmbH); MEGAFAC F142D, F172, F173, F183, F178, F191 and F471 (of DIC Corporation); FLUORAD FC-170C, FC-171, FC-430 and FC-431 (of Sumitomo 3M Limited); Surflon S-112, S-113, S-131, S-141, S-145, S-382, SC-101, SC-102, SC-103, SC-104, SC-105 and SC106 (of Asahi Glass Co., Ltd.); and F-Top EF301, 303 and 352 (of Shin-akita Chemical Co., Ltd.).

The above silicone-based surfactants include DC3PA, DC7PA, FS-1265, SF-8428, SH11PA, SH21PA, SH28PA, SH29PA, SH30PA, SH-190, SH-193 and SZ-6032 (of Dow Corning Toray Silicone Co., Ltd.) and TSF-4440, TSF-4300, TSF-4445, TSF-4446, TSF-4460 and TSF-4452 (of Momentive Performance Materials Japan LLC).

The above nonionic surfactants include polyoxyethylene alkyl ethers such as polyoxyethylene lauryl ether, polyoxyethylene stearyl ether and polyoxyethylene oleyl ether; polyoxyethylene aryl ethers such as polyoxyethylene octylphenyl ether and polyoxyethylene nonylphenyl ether; polyoxyethylene dialkyl esters such as polyoxyethylene dilaurate and polyoxyethylene distearate; and (meth)acrylate-based copolymer Polyflow Nos. 57 and 95 (of KYOEISYA CHEMICAL Co., Ltd.).

These surfactants may be used alone or in combination of two or more.

The amount of the surfactant [G] is preferably not more than 10 parts by mass, more preferably 0.01 to 10 parts by mass, much more preferably 0.05 to 5 parts by mass based on 100 parts by mass of the alkali-soluble resin [A].

When the surfactant [G] is contained within the above range, the formation of a rough film can prevented without fail at the time of forming a coating film on the substrate.

The radiation sensitive resin composition of the present invention may contain [H] an adhesive aid to further improve adhesion between the formed interlayer insulating film and the substrate. As the adhesive aid [H], a functional silane coupling agent is preferably used, as exemplified by a silane coupling agent having a reactive substituent such as carboxyl group, methacryloyl group, isocyanate group or epoxy group. Examples of the silane coupling agent include trimethoxysilylbenzoic acid, γ-methacryloxypropyl trimethoxysilane, vinyl triacetoxysilane, vinyl trimethoxysilane, γ-isocyanatopropyl triethoxysilane, γ-glycidoxypropyl trimethoxysilane and β-(3,4-epoxycyclohexyl)ethyl trimethoxysilane.

The amount of the adhesive aid [H] is preferably not more than 20 parts by mass, more preferably 0.1 to 20 parts by mass, much more preferably 1 to 15 parts by mass based on 100 parts by mass of the alkali-soluble resin [A]. When the amount of the adhesive aid [H] falls within the above range, the separation of a pattern which may occur in the development step can be prevented without fail.

Radiation Sensitive Resin Composition

The radiation sensitive resin composition of the present invention is prepared by uniformly mixing together the alkali-soluble resin [A] which is the above copolymer, the 1,2-quinonediazide compound [B], the radical trapping agent [C] and the above-described other optional components. The radiation sensitive resin composition of the present invention is preferably dissolved in a suitable solvent to be used as a solution. For example, the radiation sensitive resin composition in a solution state can be prepared by mixing together the alkali-soluble resin [A], the 1,2-quinonediazide compound [B], the radical trapping agent [C] and other optional components in a predetermined ratio in a solvent.

The solvent used to prepare the radiation sensitive resin composition of the present invention is a solvent which uniformly dissolves the alkali-soluble resin [A], the 1,2-quinonediazide compound [B], the radical trapping agent [C] and other optional components and does not react with these components.

Examples of the solvent are the same as those enumerated as the solvent which can be used to manufacture the above alkali-soluble resin [A].

Out of these solvents, alcohols, glycol ethers, ethylene glycol alkyl ether acetates, esters and diethylene glycol are preferably used from the viewpoints of the solubility of these components, reactivity with these components and the formation ease of a coating film. Out of these, benzyl alcohol, 2-phenylethyl alcohol, 3-phenyl-1-propanol, ethylene glycol monobutyl ether acetate, diethylene glycol monoethyl ether acetate, diethylene glycol diethyl ether, diethylene glycol ethyl methyl ether, diethylene glycol dimethyl ether, propylene glycol monomethyl ether, propylene glycol monomethyl ether acetate, methyl methoxypropionate and ethyl ethoxypropionate are particularly preferably used.

A high-boiling point solvent may be used in combination with the above solvent to enhance the in-plane thickness uniformity of the film. Examples of the high-boiling point solvent which can be used in combination with the solvent include N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl acetate, ethyl benzoate, diethyl oxalate, diethyl maleate, γ-butyrolactone, ethylene carbonate, propylene carbonate and phenyl cellosolve acetate. Out of these, N-methylpyrrolidone, γ-butyrolactone and N,N-dimethylacetamide are preferred.

When a high-boiling point solvent is used as the solvent for the radiation sensitive resin composition of the present invention, the amount thereof is preferably not more than 50 mass %, more preferably not more than 40 mass %, much more preferably not more than 30 mass % based on the total weight of all the solvents. When the amount of the high-boiling point solvent exceeds the above range, the thickness uniformity of the coating film, sensitivity and film residual rate may become unsatisfactory.

When the radiation sensitive resin composition of the present invention is prepared as a solution, the total content of the components other than the solvent (that is, the alkali-soluble resin [A], the 1,2-quinonediazide compound [B], the radical trapping agent [C] and other optional components) in the solution (solids content) may be arbitrarily set according to use purpose and desired film thickness value but preferably 5 to 50 mass %, more preferably 10 to 40 mass %, much more preferably 15 to 35 mass %.

The composition solution prepared as described above may be filtered with a Millipore filter having an opening diameter of 0.2 to 1.0 µm before use.

Since the radiation sensitive resin composition of the present invention prepared as described above can provide a patterned thin film which has high adhesion to a substrate, excellent solvent resistance and heat resistance, a high light transmittance and a low dielectric constant, it can be advantageously used to form an interlayer insulating film for electronic parts, a protective film for liquid crystal display elements and a spacer for liquid crystal display elements and is particularly suitable for use in the formation of an interlayer insulating film.

Formation of Interlayer Insulating Film

A description is subsequently given of a method of forming an interlayer insulating film from the radiation sensitive resin composition of the present invention. The method of forming an interlayer insulating film of the present invention comprises the following steps in the mentioned order:
(1) a step of applying the radiation sensitive resin compositor of the present invention to a substrate to form a coating film,
(2) a step of applying radiation to at least part of the coating film,
(3) a step of developing the coating film, and
(4) a step of heating the coating film.

(1) Step of Applying the Radiation Sensitive Resin Composition of the Present Invention to a Substrate to Form a Coating Film In the above step (1), the composition solution of the present invention is applied to a substrate and preferably prebaked to remove the solvent so as to form a coating film.

As the type of the substrate which can be used, glass substrates, silicon wafers and substrates having a metal formed on the surfaces of these substrates may be used.

The method of applying the composition solution is not particularly limited, and a suitable method such as spray coating, roll coating, rotational coating (spin coating), slit die coating, bar coating or ink jet coating may be employed. Spin coating and slit die coating are particularly preferred. Prebaking conditions differ according to the type and amount of each component. For example, the coating film can be prebaked at 60 to 110° C. for 30 seconds to 15 minutes. It is known that, in general, as the prebaking temperature of the radiation sensitive resin composition is set higher, the resolution is impaired more whereas as the prebaking temperature is set lower, the homogeneity of formed coating film is impaired more. Therefore, a choice between the following two options must be made for a conventionally known radiation sensitive resin composition: (1) the prebaking temperature is set low at the sacrifice of the homogeneity of the coating film to improve the resolution and (2) the prebaking temperature is set high and the impaired resolution is compensated for by the irradiation dose in the subsequent step. In either case, there arises a product yield problem. In contrast to this, as the resolution of the radiation sensitive resin composition of the present invention is not impaired even when the above prebaking temperature is raised, it has an advantage that it can be manufactured at a high product yield.

The formed coating film preferably has a thickness of 3 to 6 µm after prebaking.

(2) Step of Applying Radiation to at Least Part of the Coating Film

In the above step (2), radiation is applied to the formed coating film through a mask having a predetermined pattern. The radiation used at this point is selected from ultraviolet radiation, far ultraviolet radiation, X-radiation and charged particle radiation.

Examples of the above ultraviolet radiation include g-line (wavelength of 436 nm) and i-line (wavelength of 365 nm). Examples of the far ultraviolet radiation include KrF excimer laser beams. Examples of the X-radiation include synchrotron radiation. Examples of the charged particle radiation include electron beams.

Out of these, ultraviolet radiation is preferred, and radiation including at least one bright line selected from g-line and i-line is particularly preferred.

The irradiation dose is preferably 50 to 1,500 J/m$^2$.

(3) Development Step

The coating film after exposure to radiation is developed by using a suitable developer to remove parts exposed to the radiation so as to pattern the coating film.

As the developer used in this development step may be used an aqueous solution of an alkali (basic compound) such as sodium hydroxide, potassium hydroxide, sodium carbonate, sodium silicate, sodium metasilicate, ammonia, ethylamine, n-propylamine, diethylamine, diethylaminoethanol, di-n-propylamine, triethylamine, methyl diethylamine, dimethyl ethanolamine, triethanolamine, tetramethylammonium hydroxide, tetraethylammonium hydroxide, pyrrol, piperidine, 1,8-diazabicyclo[5.4.0]-7-undecene or 1,5-diazabicyclo[4.3.0]-5-nonane. An aqueous solution prepared by adding suitable amounts of a water-soluble organic solvent such as methanol or ethanol and a surfactant to the above alkali aqueous solution may be used as a developer.

The development method is suitably selected from puddle development, dipping development, oscillation immersion development and shower development. The development time which differs according to the composition of the composition is, for example, 30 to 120 seconds.

(4) Heating Step

After the development step (3) which is carried out as described above, the patterned thin film is preferably rinsed in running water, the entire surface of the coating film is preferably further exposed to radiation by a high-pressure mercury lamp (post-exposure) to decompose the 1,2-quinonediazide compound remaining in the thin film, and then the thin film is heated (post-baked) by a heater such as a hot plate or oven to be cured. The irradiation dose in the above post-exposure step is preferably 2,000 to 5,000 J/m$^2$.

The heating temperature for the above curing is, for example, 120 to 250° C. The heating time which differs according to the type of the heater is 5 to 30 minutes when heating is carried out on a hot plate and 30 to 90 minutes when heating is carried out in an oven. At this point, a step-baking method in which the heating step is carried out 2 times or more may also be employed.

A patterned thin film corresponding to the interlayer insulating film of interest can be thus formed on the surface of the substrate.

Interlayer Insulating Film

Since the interlayer insulating film formed as described above has excellent adhesion to the substrate, excellent solvent resistance and heat resistance, a high light transmittance and a low dielectric constant as will be made apparent from Examples which will be given hereinafter, it can be advantageously used as an interlayer insulating film for electric parts, especially liquid crystal display elements.

Liquid Crystal Display Element

The liquid crystal display element of the present invention has the above interlayer insulating film.

The liquid crystal display element of the present invention has high brightness and high reliability that its display quality does not degrade for a long time.

EXAMPLES

The following synthesis examples, examples and comparative examples are provided for the purpose of further illustrating the present invention but are in no way to be taken as limiting.

The weight average molecular weight and the number average molecular weight in the following synthesis examples are average molecular weights in terms of polystyrene measured by GPC (gel permeation chromatography (HLC-8020 of TOSOH CORPORATION)).

Synthesis Example 1

7 parts by mass of 2,2'-azobis(2,4-dimethylvaleronitrile) and 220 parts by mass of propylene glycol monomethyl ether acetate were fed to a flask equipped with a condenser tube and a stirrer. Subsequently, 22 parts by mass of methacrylic acid, 23 parts by mass of tricyclo[5.2.1.0$^{2,6}$]decan-8-yl methacrylate, 5 parts by mass of p-methoxystyrene, 50 parts by mass of 3-ethyl-3-methacryloyloxymethyl oxetane and 3 parts by mass of α-methylstyrene dimer were fed to the flask and stirred gently while the inside of the flask was substituted by nitrogen. The solution was heated at 70° C. and kept at this temperature for 4 hours so as to obtain a polymer solution containing a copolymer [A-1].

The solids content of the obtained polymer solution (the ratio of the polymer mass to the total mass of the polymer solution, the same shall apply hereinafter) was 31.1 mass %, and the polymer had a weight average molecular weight of 17,200 and a molecular weight distribution (weight average molecular weight/number average molecular weight) of 1.9.

Synthesis Example 2

7 parts by mass of 2,2'-azobis(2,4-dimethylvaleronitrile) and 220 parts by mass of diethylene glycol ethyl methyl ether were fed to a flask equipped with a condenser tube and a stirrer. Subsequently, 13 parts by mass of methacrylic acid, 50 parts by mass of glycidyl methacrylate, 10 parts by mass of 3-ethyl-3-methacryloyloxymethyl oxetane, 10 parts by mass of N-cyclohexylmaleimide, 10 parts by mass of N-(3,5-dimethyl-4-hydroxybenzyl)methacrylamide and 7 parts by mass of tetrahydrofurfuryl acrylate were fed to the flask and stirred gently while the inside of the flask was substituted by nitrogen. The solution was heated at 70° C. and kept at this temperature for 4 hours so as to obtain a polymer solution containing a copolymer [A-2].

The solids content of the obtained polymer solution was 32.1 mass %, and the polymer had a weight average molecular weight of 18,200 and a molecular weight distribution of 1.8.

Synthesis Example 3

7 parts by mass of 2,2'-azobis(2,4-dimethylvaleronitrile) and 200 parts by mass of diethylene glycol ethyl methyl ether were fed to a flask equipped with a condenser tube and a stirrer. Subsequently, 11 parts by mass of methacrylic acid, 12 parts by mass of N-phenylmaleimide, 9 parts by mass of p-methoxystyrene, 50 parts by mass of glycidyl methacrylate, 10 parts by mass of 3-ethyl-3-methacryloyloxymethyl oxetane, 5 parts by mass of n-lauryl methacrylate, 3 parts by mass of 1-(tetrahydropyran-2-oxy)-butyl-3-en-2-one and 3 parts by mass of α-methylstyrene dimer were fed to the flask and stirred gently while the inside of the flask was substituted by nitrogen. The solution was heated at 70° C. and kept at this temperature for 5 hours so as to obtain a polymer solution containing a copolymer [A-3].

The solids content of the obtained polymer solution was 32.4 mass %, and the polymer had a weight average molecular weight of 21,200 and a molecular weight distribution of 2.1.

Synthesis Example 4

8 parts by mass of 2,2'-azobis(2,4-dimethylvaleronitrile) and 220 parts by mass of diethylene glycol ethyl methyl ether were fed to a flask equipped with a condenser tube and a stirrer. Subsequently, 10 parts by mass of styrene, 20 parts by mass of methacrylic acid, 20 parts by mass of 3-ethyl-3-methacryloyloxymethyl oxetane, 30 parts by mass of glycidyl methacrylate, 8 parts by mass of 2-methylcyclohexyl acrylate, 12 parts by mass of 1-(tetrahydropyran-2-oxy)-butyl-3-en-2-one and 4.0 parts by mass of α-methylstyrene dimer were fed to the flask and stirred gently while the inside of the flask was substituted by nitrogen. The solution was heated at 70° C. and kept at this temperature for 5 hours so as to obtain a polymer solution containing a copolymer [A-4].

The solids content of the obtained polymer solution was 32.0 mass %, and the polymer had a weight average molecular weight of 20,100 and a molecular weight distribution of 1.9.

Synthesis Example 5

7 parts by mass of 2,2'-azobis(2,4-dimethylvaleronitrile) and 220 parts by mass of diethylene glycol ethyl methyl ether were fed to a flask equipped with a condenser tube and a stirrer. Subsequently, 23 parts by mass of methacrylic acid, 47 parts by mass of tricyclo[5.2.1.0$^{2,6}$]decan-8-yl methacrylate, 30 parts by mass of glycidyl methacrylate and 2 parts by mass of α-methylstyrene dimer were fed to the flask and stirred gently while the inside of the flask was substituted by nitrogen. The solution was heated at 70° C. and kept at this temperature for 5 hours so as to obtain a polymer solution containing a copolymer [A-5].

The solids content of the obtained polymer solution was 32.8 mass %, and the polymer had a weight average molecular weight of 24,000 and a molecular weight distribution of 2.3.

Synthesis Example 6

7 parts by mass of 2,2'-azobis(2,4-dimethylvaleronitrile) and 220 parts by mass of diethylene glycol ethyl methyl ether were fed to a flask equipped with a condenser tube and a stirrer. Subsequently, 25 parts by mass of methacrylic acid, 35 parts by mass of tricyclo[5.2.1.0$^{2,6}$]decan-8-yl methacrylate, 40 parts by mass of 2-hydroxyethyl methacrylate and 2.0 parts by mass of α-methylstyrene dimer were fed to the flask and stirred gently while the inside of the flask was substituted by nitrogen. The solution was heated at 70° C. and kept at this temperature for 5 hours so as to obtain a polymer solution containing a copolymer [A-6].

The solids content of the obtained polymer solution was 32.8 mass %, and the polymer had a weight average molecular weight of 25,000 and a molecular weight distribution of 2.4.

Example 1

<Preparation of Radiation Sensitive Resin Composition>

The polymer solution containing the copolymer [A-1] obtained in Synthesis Example 1 (corresponding to 100 parts by mass (solid content) of the copolymer [A-1]) as the alkali-soluble resin [A], 20 parts by mass of (4,4'-[1-[4-[1-[4-hydroxyphenyl]-1-methylethyl]phenyl]ethylidene]bisphenol-1,2-naphthoquinonediazide-5-sulfonate) which is a condensate of 4,4'-[1-[4-[1-[4-hydroxyphenyl]-1-methylethyl]phenyl]ethylidene]bisphenol (1 mole) and 1,2-naphthoquinonediazide-5-sulfonic acid chloride (2 moles) as the 1,2-quinonediazide compound [B], 1 part by mass of 1,3,5-tris(3',5'-di-tert-butyl-4'-hydroxybenzyl)isocyanuric acid (trade name: ADECASTAB AO-20, manufactured by ADEKA Corporation) as the radical trapping agent [C] and 5 parts by mass of γ-methacryloxypropyl trimethoxysilane as the adhesive aid [H] were mixed together, propylene glycol monomethyl ether acetate was added to dissolve the mixture so as ensure that the solids content of the resulting solution became 30 mass %, and the obtained solution was filtered with a Millipore filter having an opening diameter of 0.5 µm so as to prepare a radiation sensitive resin composition (S-1).

<Formation and Evaluation of Patterned Thin Film (Interlayer Insulating Film)>

(I) Formation of Patterned Thin Film

The above radiation sensitive resin composition (S-1) was applied to a glass substrate by using a spinner and prebaked on a hot plate at 80° C. for 3 minutes to form a coating film.

Ultraviolet radiation having an intensity at 365 nm of 10 mW/cm² was applied to the obtained coating film through a predetermined pattern mask for 15 seconds. Then, the coating film was developed by using an aqueous solution containing 0.5 mass % of tetramethylammonium hydroxide at 25° C. for 1 minute and rinsed in pure water for 1 minute. Unrequired portions were removed by these operations.

After ultraviolet radiation having an intensity at 365 nm of 10 mW/cm² was applied to the formed patterned film for 30 seconds, the patterned film was heated in an oven at 220° C. for 60 minutes to be cured so as to obtain a patterned thin film having a thickness of 3 µm.

(II) Evaluation of Resolution

A pattern was formed in the same manner as in (I) above except that the prebaking temperature was changed to 90° C.

The resolution was evaluated based on the following criteria by changing the prebaking temperature to 80° C. and 90° C.

A punched pattern (5 µm×5 µm holes) can be resolved: Excellent

A punched pattern (5 µm×5 µm holes) cannot be resolved but a punched pattern (8 µm×8 µm holes) can be resolved: satisfactory Both patterns (5 µm×5 µm holes) (8 µm×8 µm holes) cannot be resolved: unsatisfactory The evaluation results are shown in Table 2.

(III) Evaluation of Transparency

The light transmittance at a wavelength of 400 nm of the glass substrate having a patterned thin film formed at a prebaking temperature of 80° C. in (I) above were measured with a spectrophotometer (150-20 Double Beam of Hitachi, Ltd.) using a glass substrate having no thin film as a reference. The results are shown in Table 2.

It can be said that when the transmittance is not less than 90%, transparency is satisfactory and when the transmittance is less than 90%, transparency is unsatisfactory.

(IV) Evaluation of Heat Discoloration Resistance

The transparency of the glass substrate having a patterned thin film used for the evaluation of transparency in (III) above after it was heated in an oven at 250° C. for 1 hour was measured in the same manner as in (III) above. A change in transmittance before and after heating was checked. The change rate at this point is shown in Table 2.

It can be said that when the change rate is less than 5%, heat discoloration resistance is satisfactory and when the change rate is more than 5%, heat discoloration resistance is unsatisfactory.

(V) Evaluation of Heat-Resistant Dimensional Stability

A substrate having a patterned thin film formed in the same manner as in (I) above at a prebaking temperature of 80° C. was heated in an oven at 220° C. for 60 minutes. The change rate of the film thickness of the patterned thin film before and after heating is shown in Table 2.

It can be said that when the dimensional change rate is not more than 5% before and after heating, heat-resistant dimensional stability is satisfactory and when the dimensional change rate is more than 5%, heat-resistant dimensional stability is unsatisfactory.

(VI) Evaluation of Adhesion

A cross-cut adhesion test was made after a pressure cooker test (120° C., humidity of 100%, 4 hours) to evaluate the adhesion of a patterned thin film which was formed in the same manner as in (I) above at a prebaking temperature of 80° C. The evaluation results are shown in Table 2.

The evaluation result is expressed by the number of remaining squares out of 100 squares.

(VII) Evaluation of Storage Stability

The radiation sensitive resin composition (S-1) prepared above was kept in an oven at 40° C. for 1 week to evaluate its storage stability based on a change in viscosity before and after storage. The viscosity change rate is shown in Table 2.

It can be said that when this change rate is less than 5%, storage stability is satisfactory and when the change rate is not less than 5%, storage stability is unsatisfactory.

Examples 2 to 40 and Comparative Examples 1 to 6

Radiation sensitive resin compositions were prepared in the same manner as in Example 1 except that the types and amounts of the alkali-soluble resin [A], the 1,2-quinonediazide compound [B] and the radical trapping agent [C] were changed as shown in Table 1, and patterned thin films (interlayer insulating films) were formed from these and evaluated in the same manner as in Example 1.

The evaluation results are shown in Table 2.

Symbols for components in Table 1 represent the following compounds.

[B] 1,2-Quinonediazide Compound

B-1: condensate of 4,4'-[1-[4-[1-[4-hydroxyphenyl]-1-methylethl]phenyl]ethylidenen]bisphenol (1.0 mole) and 1,2-naphthoquinonediazide-5-sulfonic acid chloride (2.0 moles)

B-2: condensate of 1,1,1-tri(p-hydroxyphenyl)ethane (1.0 mole) and 1,2-naphthoquinonediazide-5-sulfonic acid chloride (2.0 moles)

[C] Radical Trapping Agent

C-1: 1,3,5-tris(3',5'-di-tert-butyl-4'-hydroxybenzyl)isocyanuric acid (ADECASTAB AO-20 manufactured by ADEKA Corporation)

C-2: 1,1,3-tris(2-methyl-4-hydroxy-5-tert-butylphenyl)butane (ADECASTAB AO-30, manufactured by ADEKA Corporation)

C-3: 4,4'-butylidenebis(6-tert-butyl-3-methylphenol) (ADECASTAB AO-40, manufactured by ADEKA Corporation)

C-4: n-octadecyl 3-(4'-hydroxy-3',5'-di-tert-butylphenyl)propionate (ADECASTAB AO-50, manufactured by ADEKA Corporation)

C-5: pentaerythritol tetrakis[3-(3',5'-di-tert-butyl-4'-hydroxyphenyl)propionate] (ADECASTAB AO-60, manufactured by ADEKA Corporation)

C-6: 3,6-dioxaoctamethylene-bis[3-(3-tert-butyl-4-hydroxy-5-methylphenyl)propionate] (ADECASTAB AO-70, manufactured by ADEKA Corporation)

C-7: 3,9-bis[1,1-dimethyl-2-[β-(3-t-butyl-4-hydroxy-5-methylphenyl)propionyloxy]ethyl]2,4,8,10-tetraoxaspiro[5.5]undecane (ADECASTAB AO-80, manufactured by ADEKA Corporation)

C-8: 1,3,5-trimethyl-2,4,6-tris(3,5-di-tert-butyl-4-hydroxybenzyl)benzene (ADECASTAB AO-330, manufactured by ADEKA Corporation)

C-9: butylidenebis{2-tert-butyl-5-methyl-p-phenylene}-P,P,P,P-tetratridecylbis(phosphine) (ADECASTAB AO-260, manufactured by ADEKA Corporation)

C-10: distearyl pentaerythritol diphosphite (ADECASTAB PEP-8, manufactured by ADEKA Corporation)

C-11: 2,2'-methylenebis(4,6-di-tert-butyl-1-phenyloxy)(2-ethylhexyloxy)phosphorus (ADECASTAB HP-10, manufactured by ADEKA Corporation)

C-12: tris(2,4-di-tert-butylphenyl)phosphite (ADECASTAB 2112, manufactured by ADEKA Corporation)

C-13: 3,9-bis(2,6-di-tert-butyl-4-methylphenoxy)-2,4,8,10-tetraoxa-3,9-diphosphaspiro[5.5]undecane (ADECASTAB PEP-36, manufactured by ADEKA Corporation)

C-14: pentaerythritol tetrakis(3-laurylthiopropionate) (ADECASTAB AO-412S, manufactured by ADEKA Corporation)

C-15: di(propionate-n-tridecanyl)sulfide (ADECASTAB AO-503S, manufactured by ADEKA Corporation)

C-16: thiodiethylene bis[3-(3,5-di-tert-butyl-4-hydroxyphenyl)propionate] (IRGANOX 1035, manufactured by Ciba Specialty Chemicals)

C-17: tetrakis(2,2,6,6-pentamethyl-4-piperidyl)1,2,3,4-butane tetracarboxylate (ADECASTAB LA-57, manufactured by ADEKA Corporation)

C-18: bis(1-octyloxy-2,2,6,6-tetramethyl-4-piperidyl)sebacate (TINUVIN 123, manufactured by Ciba Specialty Chemicals)

C-19: bis(1,2,2,6,6-pentamethyl-4-piperidyl)[[3,5-bis(1,1-dimethylethyl)-4-hydroxyphenyl]methyl]butyl malonate (TINUVIN 144, manufactured by Ciba Specialty Chemicals)

When there are a plurality of names and a plurality of amounts by using "/" in the component columns in Table 1, a plurality of components are used in combination.

TABLE 1

| | (A) Alkali-soluble resin | | (B) 1,2-quinonediazide compound | | (C) radical trapping agent | |
|---|---|---|---|---|---|---|
| | Type | Parts by mass | Type | Parts by mass | Type | Parts by mass |
| Example 1 | A-1 | 100 | B-1 | 20 | C-1 | 1 |
| Example 2 | A-2 | 100 | B-1 | 20 | C-2 | 1 |
| Example 3 | A-3 | 100 | B-1 | 20 | C-3 | 1 |
| Example 4 | A-4 | 100 | B-1 | 20 | C-4 | 1 |
| Example 5 | A-1 | 100 | B-1 | 30 | C-5 | 1 |
| Example 6 | A-2 | 100 | B-1 | 30 | C-6 | 1 |
| Example 7 | A-3 | 100 | B-1/B-2 | 15/15 | C-7 | 1 |
| Example 8 | A-4 | 100 | B-1 | 20 | C-8 | 2 |
| Example 9 | A-2 | 100 | B-1 | 20 | C-1 | 2 |
| Example 10 | A-2 | 100 | B-1/B-2 | 15/15 | C-2 | 1 |
| Example 11 | A-3 | 100 | B-1 | 20 | C-3 | 1 |
| Example 12 | A-4 | 100 | B-1 | 20 | C-1/C-8 | 1/1 |
| Example 13 | A-1 | 100 | B-1/B-2 | 15/15 | C-1/C-10 | 2/1 |
| Example 14 | A-2 | 100 | B-1 | 20 | C-2/C-9 | 1/1 |
| Example 15 | A-3 | 100 | B-1 | 20 | C-8/C-9 | 1/1 |
| Example 16 | A-4 | 100 | B-1 | 20 | C-8/C-12 | 1/1 |
| Example 17 | A-1 | 100 | B-1 | 20 | C-17 | 1 |
| Example 18 | A-1 | 100 | B-1 | 20 | C-18 | 1 |
| Example 19 | A-1 | 100 | B-1 | 20 | C-19 | 1 |
| Example 20 | A-2 | 100 | B-1 | 20 | C-14 | 1 |
| Example 21 | A-2 | 100 | B-1 | 20 | C-15 | 1 |
| Example 22 | A-2 | 100 | B-1 | 20 | C-16 | 1 |
| Example 23 | A-3 | 100 | B-1/B-2 | 10/15 | C-1/C-11 | 2/1 |
| Example 24 | A-3 | 100 | B-1/B-2 | 10/15 | C-7/C-13 | 3/1 |
| Example 25 | A-1 | 100 | B-1 | 20 | C-1/C-11/C-17 | 1/1/1 |
| Example 26 | A-1 | 100 | B-1 | 20 | C-8/C-9/C-14 | 1/1/1 |
| Example 27 | A-1 | 100 | B-1 | 20 | C-8/C-11/C-15/C-17 | 1/1/1/1 |
| Example 28 | A-1 | 100 | B-1 | 20 | C-1/C-8/C-9/C-17 | 1/1/1/0.1 |
| Example 29 | A-4 | 100 | B-1/B-2 | 10/15 | C-1/C-12/C-16/C-19 | 1/1/1/1 |
| Example 30 | A-4 | 100 | B-2 | 30 | C-9 | 5 |
| Example 31 | A-4 | 100 | B-1/B-2 | 15/15 | C-10 | 3 |
| Example 32 | A-4 | 100 | B-1/B-2 | 15/15 | C-11 | 3 |
| Example 33 | A-4 | 100 | B-1/B-2 | 15/15 | C-12 | 3 |
| Example 34 | A-4 | 100 | B-1/B-2 | 15/15 | C-13 | 3 |
| Example 35 | A-2 | 100 | B-1 | 30 | C-9/C-13 | 2/1 |
| Example 36 | A-2 | 100 | B-1 | 30 | C-14/C-15 | 1/1 |
| Example 37 | A-1 | 100 | B-1 | 30 | C-17/C-18 | 1/1 |

TABLE 1-continued

|  | (A) Alkali-soluble resin | | (B) 1,2-quinonediazide compound | | (C) radical trapping agent | |
| --- | --- | --- | --- | --- | --- | --- |
|  | Type | Parts by mass | Type | Parts by mass | Type | Parts by mass |
| Example 38 | A-1/A-2 | 50/50 | B-1/B-2 | 15/15 | C-5/C-17 | 2/1 |
| Example 39 | A-1/A-3 | 50/50 | B-1/B-2 | 15/15 | C-7/C-18 | 2/1 |
| Example 40 | A-1/A-4 | 50/50 | B-1/B-2 | 15/15 | C-8/C-19 | 2/1 |
| C. Ex. 1 | A-1 | 100 | B-1 | 20 | — | — |
| C. Ex. 2 | A-2 | 100 | B-1 | 20 | — | — |
| C. Ex. 3 | A-3 | 100 | B-1 | 20 | — | — |
| C. Ex. 4 | A-4 | 100 | B-1 | 20 | — | — |
| C. Ex. 5 | A-1R | 100 | B-1 | 20 | — | — |
| C. Ex. 6 | A-2R | 100 | B-1 | 20 | — | — |

C. Ex.: Comparative Example

TABLE 2

|  | Evaluation of resolution | | Transparency, Transmittance (%) | Heat discoloration resistance, Change rate (%) | Heat-resistant dimensional stability (%) | Adhesion (number of squares/100) | Storage stability, Viscosity change rate (%) |
| --- | --- | --- | --- | --- | --- | --- | --- |
|  | 80° C. | 90° C. |  |  |  |  |  |
| Ex. 1 | Excellent | Excellent | 93 | 4 | 3 | 100/100 | 2 |
| Ex. 2 | Excellent | Excellent | 93 | 3 | 4 | 100/100 | 4 |
| Ex. 3 | Excellent | Excellent | 93 | 4 | 4 | 100/100 | 3 |
| Ex. 4 | Excellent | Excellent | 94 | 4 | 4 | 100/100 | 4 |
| Ex. 5 | Excellent | Excellent | 93 | 4 | 3 | 100/100 | 2 |
| Ex. 6 | Excellent | Excellent | 93 | 4 | 4 | 100/100 | 4 |
| Ex. 7 | Excellent | Excellent | 93 | 4 | 4 | 100/100 | 3 |
| Ex. 8 | Excellent | Excellent | 93 | 4 | 4 | 100/100 | 4 |
| Ex. 9 | Excellent | Excellent | 92 | 4 | 4 | 100/100 | 4 |
| Ex. 10 | Excellent | Excellent | 93 | 4 | 4 | 100/100 | 4 |
| Ex. 11 | Excellent | Excellent | 92 | 3 | 4 | 100/100 | 4 |
| Ex. 12 | Excellent | Excellent | 93 | 4 | 4 | 100/100 | 4 |
| Ex. 13 | Excellent | Excellent | 93 | 4 | 3 | 100/100 | 2 |
| Ex. 14 | Excellent | Excellent | 93 | 4 | 4 | 100/100 | 4 |
| Ex. 15 | Excellent | Excellent | 94 | 4 | 4 | 100/100 | 4 |
| Ex. 16 | Excellent | Excellent | 93 | 4 | 4 | 100/100 | 4 |
| Ex. 17 | Excellent | Excellent | 93 | 4 | 3 | 100/100 | 2 |
| Ex. 18 | Excellent | Excellent | 92 | 3 | 3 | 100/100 | 2 |
| Ex. 19 | Excellent | Excellent | 93 | 4 | 3 | 100/100 | 2 |
| Ex. 20 | Excellent | Excellent | 93 | 4 | 4 | 100/100 | 4 |
| Ex. 21 | Excellent | Excellent | 93 | 4 | 4 | 100/100 | 4 |
| Ex. 22 | Excellent | Excellent | 93 | 4 | 4 | 100/100 | 3 |
| Ex. 23 | Excellent | Excellent | 95 | 4 | 4 | 100/100 | 4 |
| Ex. 24 | Excellent | Excellent | 93 | 3 | 4 | 100/100 | 4 |
| Ex. 25 | Excellent | Excellent | 93 | 4 | 3 | 100/100 | 2 |
| Ex. 26 | Excellent | Excellent | 93 | 4 | 3 | 100/100 | 2 |
| Ex. 27 | Excellent | Excellent | 93 | 4 | 3 | 100/100 | 2 |
| Ex. 28 | Excellent | Excellent | 93 | 4 | 3 | 100/100 | 2 |
| Ex. 29 | Excellent | Excellent | 93 | 4 | 4 | 100/100 | 4 |
| Ex. 30 | Excellent | Excellent | 93 | 3 | 4 | 100/100 | 4 |
| Ex. 31 | Excellent | Excellent | 93 | 4 | 4 | 100/100 | 4 |
| Ex. 32 | Excellent | Excellent | 93 | 4 | 4 | 100/100 | 4 |
| Ex. 33 | Excellent | Excellent | 92 | 4 | 4 | 100/100 | 4 |
| Ex. 34 | Excellent | Excellent | 93 | 3 | 4 | 100/100 | 3 |
| Ex. 35 | Excellent | Excellent | 92 | 4 | 4 | 100/100 | 4 |
| Ex. 36 | Excellent | Excellent | 93 | 4 | 4 | 100/100 | 4 |
| Ex. 37 | Excellent | Excellent | 92 | 4 | 3 | 100/100 | 2 |
| Ex. 38 | Excellent | Excellent | 93 | 4 | 4 | 100/100 | 4 |
| Ex. 39 | Excellent | Excellent | 94 | 4 | 4 | 100/100 | 4 |
| Ex. 40 | Excellent | Excellent | 93 | 3 | 4 | 100/100 | 3 |
| C. Ex. 1 | Satisfactory | Unsatisfactory | 91 | 7 | 6 | 100/100 | 7 |
| C. Ex. 2 | Satisfactory | Unsatisfactory | 92 | 7 | 7 | 100/100 | 8 |
| C. Ex. 3 | Satisfactory | Unsatisfactory | 92 | 7 | 7 | 100/100 | 7 |
| C. Ex. 4 | Satisfactory | Unsatisfactory | 92 | 7 | 7 | 100/100 | 7 |
| C. Ex. 5 | Unsatisfactory | Unsatisfactory | 93 | 7 | 10 | 100/100 | 15 |
| C. Ex. 6 | Excellent | Excellent | 85 | 8 | 4 | 50/100 | 3 |

Ex.: Example C. Ex.: Comparative Example

As described in the Examples, the radiation sensitive resin composition of the present invention can be advantageously used as an interlayer insulating film for electronic parts, especially liquid crystal display elements. A film formed from the radiation sensitive resin composition of the present invention has excellent light transmittance and adhesion to a substrate, high planarizing ability, a low dielectric constant, high heat-resistant dimensional stability and excellent heat discoloration resistance. Therefore, it can also be advantageously used as a planarizing film or protective film and an organic insulating film for liquid crystal display elements in addition town interlayer insulating film for electronic parts.

Application sites of the radiation sensitive resin composition of the present invention will be described hereinunder with reference to the drawings.

FIG. 1 shows an application example of the interlayer insulating film in a liquid crystal display element explained above. FIG. 1 is a sectional view of an example of a liquid crystal display element disclosed by Japanese Patent No. 3247870. The radiation sensitive resin composition of the present invention can be advantageously used to form the interlayer insulating film 38 of the liquid crystal display element shown in FIG. 1.

Figure 2:
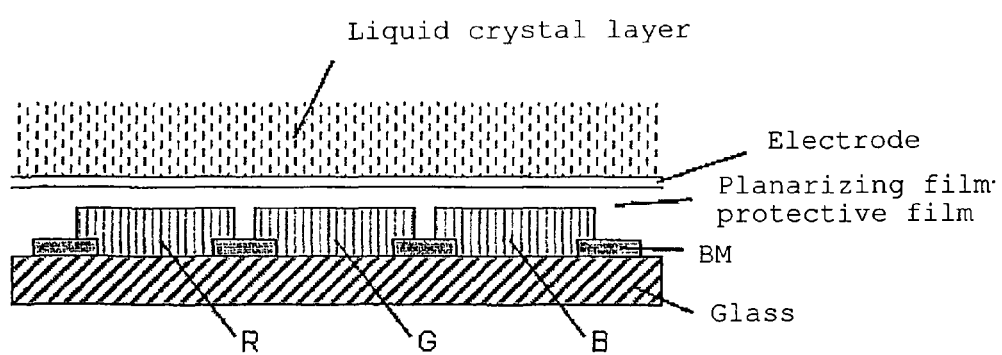
FIG. 2 is a sectional view of another example of a liquid crystal display element to which the radiation sensitive resin composition of the present invention can be applied.

FIG. 2 is a schematic sectional view of a typical liquid crystal display element. The radiation sensitive resin composition of the present invention can be advantageously used to form a planarizing film or protective film for the liquid crystal display element of FIG. 2. This planarizing film or protective film needs to be excellent in various properties such as light transmittance, adhesion to a substrate, planarizing performance and heat-resistant dimensional stability.

Figure 3:
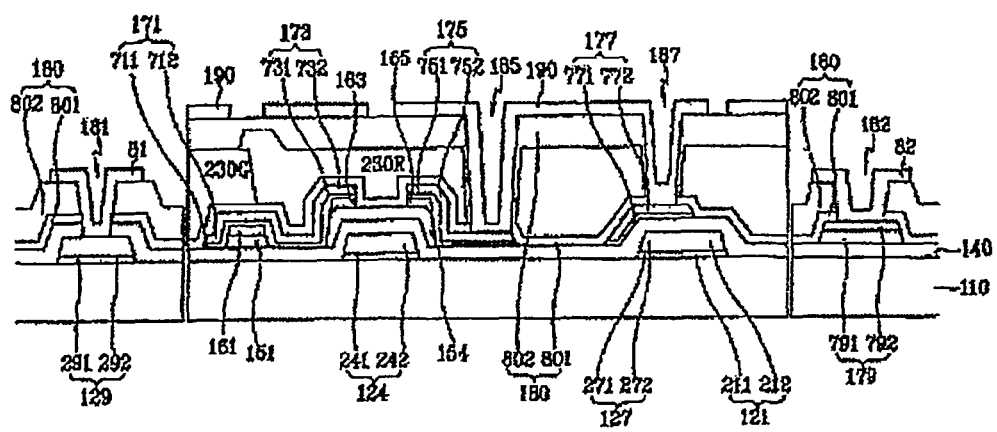
FIG. 3 is a sectional view of still another example of a liquid crystal display element to which the radiation sensitive resin composition of the present invention can be applied.

FIG. 3 is a sectional view of an example of a liquid crystal display element disclosed by JP-A 2005-18082. The radiation sensitive resin composition of the present invention can be advantageously used to form the second protective film 802 of the liquid crystal display element of FIG. 3. This second protective film 802 must have a low dielectric constant.

Figure 4:
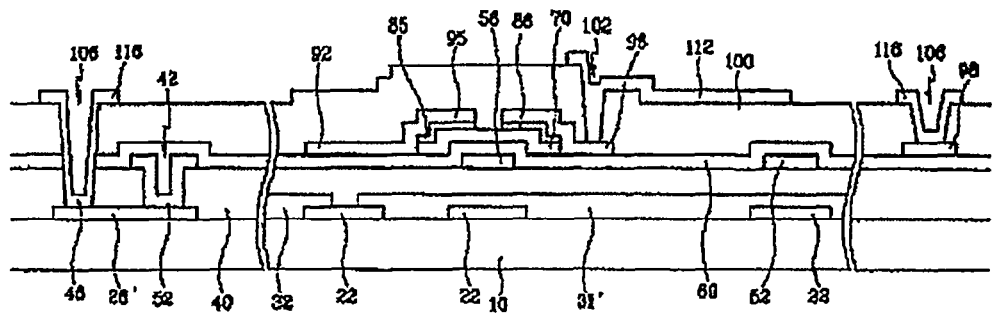
FIG. 4 is a sectional view of a further example of a liquid crystal display element to which the radiation sensitive resin composition of the present invention can be applied.

FIG. 4 is a sectional view of an example of a liquid crystal display element disclosed by JP-A 2001-166338. The radiation sensitive resin composition of the present invention can be advantageously used to form the organic insulating film 40 of the liquid crystal display element of FIG. 4.

EFFECT OF THE INVENTION

According to the present invention, there is provided a radiation sensitive resin composition capable of providing an interlayer insulating film which satisfies general requirements for an interlayer insulating film such as high light transmittance and has excellent heat-resistant dimensional stability, heat discoloration resistance and adhesion to a substrate along with the improvement of process efficiency for improving product yield at a high resolution and having excellent storage stability.

Since the film formed by the method of the present invention has a high light transmittance, a high dielectric constant and excellent planarizing performance, heat-resistant dimensional stability, heat discoloration resistance and adhesion to a substrate, it can be advantageously used as an interlayer insulating film for electronic parts, especially liquid crystal display elements and also as a planarizing film or protective film and an organic insulating film for liquid crystal display elements.

EXPLANATION OF SYMBOLS

BM, 22: black matrix
R: red color filter
G: green color filter
B: blue color filter
10: lower insulating substrate
21: pixel electrode
23: source wiring
24: TFT
25: connection electrode
26: contact hole
26': gate pad
31: transparent insulating substrate
31', 32': color filter
32: gate electrode
33: gate insulating film
34: channel protective layer
35, 70: semiconductor layer
36a: source electrode
36b: drain electrode
37a, 37a': transparent conductive film
37b, 37b': metal layer
38: interlayer insulating film
40: organic insulating film
42, 46, 102, 106: contact hole
52: gate wiring
56: gate electrode
60: gate insulating film
81, 82: contact auxiliary member
85, 86: resistant contact layer
92: data line
95: source electrode
96: drain electrode
100: protective film
110: insulating substrate
112: pixel electrode
116: auxiliary gate pad
118: auxiliary data pad
121: gate wiring
124: gate electrode
127: extension part of gate wiring
129: end part of gate wiring
140: gate insulating film
151: linear semiconductor
154: projecting part of linear semiconductor
161: linear resistant contact member
163: projecting part of linear contact member
165: island-like contact member
171: data line
173: source electrode
175: drain electrode
177: conductor for maintenance capacitors
179: end part of data line
180: protective film
181, 182, 185, 187: contact hole
190: pixel electrode
211: lower film of gate wiring
212: upper film of gate wiring
230R: red color filter
230G: green color filter
241: lower film of gate electrode
242: upper film of gate electrode
271: lower film of extension part of gate electrode
272: upper film of extension part of gate electrode
291: lower film of end part of gate electrode
292: upper film of end part of gate electrode
711: lower film of data line
712: upper film of data line
731: lower film of source electrode
732: upper film of source electrode
751: lower film of drain electrode
752: upper film of drain electrode
771: lower film of extension part of gate wiring
772: upper film of extension part of gate wiring
791: lower film of end part of data line
792: upper film of end part of data line
801: first protective film
802: second protective film

The invention claimed is:

1. A radiation sensitive resin composition comprising:
   [A] an alkali-soluble resin;
   [B] a 1,2-quinonediazide compound; and
   [C] a radical trapping agent,
   wherein said alkali-soluble resin [A] is a copolymer of (a1), (a2-1) and (a2-2) where (a1) is at least one selected from the group consisting of unsaturated carboxylic acids and unsaturated carboxylic anhydrides, (a2-1) is an unsaturated compound containing an epoxy group, and (a2-2) is an unsaturated compound different from (a1) and (a2-1),
   and wherein said radical trapping agent [C] is at least one compound selected from the group consisting of radical trapping agents C-1-C-19:
   C-1: 1,3,5-tris(3',5'-di-tert-butyl-4'-hydroxybenzyl)isocyanuric acid;
   C-2: 1,1,3-tris(2-methyl-4-hydroxy-5-tert-butylphenyl) butane;
   C-3: 4,4'-butylidenebis(6-tert-butyl-3-methylphenol);
   C-4: n-octadecyl 3-(4'-hydroxy-3',5'-di-tert-butylphenyl) propionate;
   C-5: pentaerythritol tetrakis[3-(3',5'-di-tert-butyl-4'-hydroxyphenyl)propionate];
   C-6: 3,6-dioxaoctamethylene-bis[3-(3-tert-butyl-4-hydroxy-5 methylphenyl)propionate];
   C-7: 3,9-bis[1,1-dimethyl-2-[β-(3-t-butyl-4-hydroxy-5 methylphenyl)propionyloxy]ethyl]2,4,8,10-tetraoxaspiro[5.5]undecane;
   C-8: 1,3,5-trimethyl-2,4,6-tris(3,5-di-tert-butyl-4-hydroxybenzyl)benzene;
   C-9: butylidenebis {2-tert-butyl-5-methyl-p-phenylene}-P,P,P,P-tetramidecylbis(phosphine);
   C-10: distearyl pentaerythritol diphosphite;
   C-11: 2,2'-methylenebis(4,6-di-tert-butyl-1-phenyloxy) (2-ethylhexyloxy)phosphorus;
   C-12: tris(2,4-di-tert-butylphenyl)phosphite;
   C-13: 3,9-bis(2,6-di-tert-butyl-4-methylphenoxy)-2,4,8, 10-tetraoxa-3,9-diphosphaspiro[5.5]undecane;
   C-14: pentaerythritol tetrakis(3-laurylthiopropionate);
   C-15: di(propionate-n-tridecanyl)sulfide;
   C-16: thiodiethylene bis[3-(3,5-di-tert-butyl-4-hydroxyphenyl)propionate];
   C-17: tetrakis(2,2,6,6-pentamethyl-4-piperidyl) 1,2,3,4-butane tetracarboxylate;
   C-18: bis(1-octyloxy-2,2,6,6-tetramethyl-4-piperidyl)sebacate; and
   C-19: bis(1,2,2,6,6-pentamethyl-4-piperidyl)[[3,5-bis(1, 1-dimethylethyl)-4-hydroxyphenyl]methyl]butyl malonate.

2. The radiation sensitive resin composition according to claim 1, wherein (a2-2) is at least one selected from the group consisting of methacrylic acid alkyl esters, methacrylic acid cyclic alkyl esters, acrylic acid alkyl esters, acrylic acid cyclic alkyl esters, methacrylic acid aryl esters, acrylic acid aryl esters, unsaturated dicarboxylic acid diesters, methacrylic acid esters having a hydroxyl group, bicyclo unsaturated compounds, maleimide compounds, unsaturated aromatic compounds, conjugated dienes, phenolic hydroxyl group-containing unsaturated compounds represented by the following formula (I):

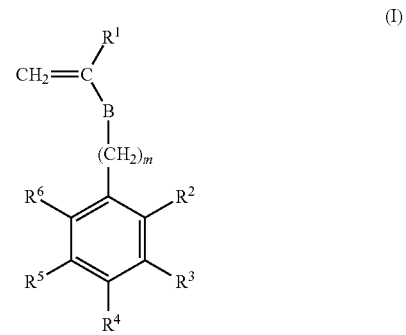

in the formula (I), $R^1$ is a hydrogen atom or alkyl group having 1 to 4 carbon atoms, $R^2$ to $R^6$ are each independently a hydrogen atom, hydroxyl group or alkyl group having 1 to 4 carbon atoms, B is a single bond, —COO— or —CONH—, and m is an integer of 0 to 3, with the proviso that at least one of $R^2$ to $R^6$ is a hydroxyl group and any bonding directions of —COO— and —CONH— are acceptable), and unsaturated compounds having a tetrahydrofuran skeleton, furan skeleton, tetrahydropyran skeleton, pyran skeleton or skeleton represented by the following formula (II):

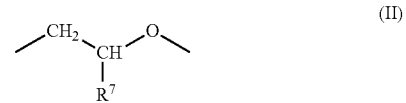

in the formula (II), $R^7$ is a hydrogen atom or methyl group).

3. The radiation sensitive resin composition according to claim 2, wherein the content of a constituent unit derived from (a1) in alkali-soluble resin [A] is 5 to 40 mass % based on the total of recurring units derived from (a1) (a2-1) and (a2-2).

4. The radiation sensitive resin composition according to any one of claims 1, 2 or 3, wherein the amount of the 1,2-quinonediazide compound [B] is 5 to 100 parts by mass based on 100 parts by mass of the alkali-soluble resin [A], and the amount of the radical trapping agent [C] is 0.1 to 30 parts by mass based on 100 parts by mass of the alkali-soluble resin [A].

5. The radiation sensitive resin composition according to any one of claims 1, 2 or 3 which is in the form of an interlayer insulating film.

6. A method of forming an interlayer insulating film, comprising the following steps in the mentioned order:
   (1) applying the radiation sensitive resin composition of claim 1 to a substrate to form a coating film;
   (2) applying radiation to at least part of the coating film;
   (3) developing the coating film; and
   (4) heating the coating film.

7. A liquid crystal display element comprising an interlayer insulating film formed from the radiation sensitive resin composition of claim 1.

8. The radiation sensitive resin composition according to any one of claims 1, 2 or 3 which is in the form of a planarizing film, protective film or organic insulating film for liquid crystal display elements.

9. The radiation sensitive resin composition according to claim 1, wherein (a2-1) is at least one selected from the group consisting of glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, o-vinylbenzyl glycidyl ether, m-vinylbenzyl glycidyl ether and p-vinylbenzyl glycidyl ether, 3-(methacryloyloxymethyl)oxetane, 3-(methacryloyloxymethyl)-3-ethyl oxetane, 3-(methacryloyloxymethyl)-2-methyl oxetane, 3-(methacryloyloxymethyl)-2-phenyl oxetane, 3-(methacryloyloxyethyl)oxetane, 3-(methacryloyloxyethyl)-3-ethyl oxetane, 2-ethyl-3-(methacryloyloxyethyl)oxetane and 3-(methacryloyloxyethyl)-2-phenyl oxetane.

10. The radiation sensitive resin composition according to claim 2, wherein (a2-1) is at least one selected from the group consisting of glycidyl acrylate, glycidyl methacrylate, glycidyl α-ethylacrylate, glycidyl α-n-propylacrylate, glycidyl α-n-butylacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethylacrylate, o-vinylbenzyl glycidyl ether, m-vinylbenzyl glycidyl ether and p-vinylbenzyl glycidyl ether, 3-(methacryloyloxymethyl)oxetane, 3-(methacryloyloxymethyl)-3-ethyl oxetane, 3-(methacryloyloxymethyl)-2-methyl oxetane, 3-(methacryloyloxymethyl)-2-phenyl oxetane, 3-(methacryloyloxyethyl)oxetane, 3-(methacryloyloxyethyl)-3-ethyl oxetane, 2-ethyl-3-(methacryloyloxyethyl)oxetane and 3-(methacryloyloxyethyl)-2-phenyl oxetane.

11. The radiation sensitive resin composition according to claim 1, wherein the 1,2-quinonediazide compound [B] is at least one selected from the group consisting of 1,2-naphthoquinonediazide sulfonates of trihydroxybenzophenone, 1,2-naphthoquinonediazide sulfonates of tetrahydroxybenzophenone, 1,2-naphthoquinonediazide sulfonates of pentahydroxybenzophenone, 1,2-naphthoquinonediazide sulfonates of hexahydroxybenzophenone, 1,2-naphthoquinonediazide sulfonates of (polyhydroxyphenyl)alkanes, 1,2-benzoquinonediazide sulfonic acid amide and 1,2-naphthoquinonediazide sulfonic acid amide.

12. The radiation sensitive resin composition according to claim 10, wherein the 1,2-quinonediazide compound [B] is at least one selected from the group consisting of 1,2-naphthoquinonediazide sulfonates of trihydroxybenzophenone, 1,2-naphthoquinonediazide sulfonates of tetrahydroxybenzophenone, 1,2-naphthoquinonediazide sulfonates of pentahydroxybenzophenone, 1,2-naphthoquinonediazide sulfonates of hexahydroxybenzophenone, 1,2-naphthoquinonediazide sulfonates of (polyhydroxyphenyl)alkanes, 1,2-benzoquinonediazide sulfonic acid amide and 1,2-naphthoquinonediazide sulfonic acid amide.

* * * * *